US010359681B2

(12) United States Patent
Brown

(10) Patent No.: US 10,359,681 B2
(45) Date of Patent: Jul. 23, 2019

(54) MULTI-PANE WINDOWS INCLUDING ELECTROCHROMIC DEVICES AND ELECTROMECHANICAL SYSTEMS DEVICES

(71) Applicant: Stephen C. Brown, San Mateo, CA (US)

(72) Inventor: Stephen C. Brown, San Mateo, CA (US)

(73) Assignee: View, Inc., Milpitas, CA (US)

( * ) Notice: Subject to any disclaimer, the term of this patent is extended or adjusted under 35 U.S.C. 154(b) by 0 days.

(21) Appl. No.: 14/443,353

(22) PCT Filed: Nov. 26, 2013

(86) PCT No.: PCT/US2013/072085
§ 371 (c)(1),
(2) Date: May 15, 2015

(87) PCT Pub. No.: WO2014/082092
PCT Pub. Date: May 30, 2014

(65) Prior Publication Data
US 2015/0338713 A1  Nov. 26, 2015

Related U.S. Application Data

(60) Provisional application No. 61/729,987, filed on Nov. 26, 2012.

(51) Int. Cl.
*B81B 7/02* (2006.01)
*G02F 1/157* (2006.01)
(Continued)

(52) U.S. Cl.
CPC ........ *G02F 1/157* (2013.01); *B32B 17/10055* (2013.01); *B32B 17/10513* (2013.01);
(Continued)

(58) Field of Classification Search
CPC ..... G02F 1/00; G02F 1/01; G02F 1/15; G02F 1/1506; G02F 1/1508; G02F 1/153;
(Continued)

(56) References Cited

U.S. PATENT DOCUMENTS 7,450,291 B2   11/2008  Guarr et al.
8,164,818 B2 *  4/2012  Collins ............ B32B 17/10055
                                                345/49
(Continued)

FOREIGN PATENT DOCUMENTS

EP           1640762 A2      3/2006
WO    WO 2009/133503 A1    11/2009
WO    WO 2014/082092        5/2014

OTHER PUBLICATIONS

International Search Report dated Mar. 6, 2014 for PCT/US2013/072085.
International Preliminary Report on Patentability dated Jun. 4, 2015 issued in PCT/US2013/072085.

*Primary Examiner* — Robert E. Tallman
(74) *Attorney, Agent, or Firm* — Weaver Austin Villeneuve & Sampson LLP; Brian D. Griedel

(57) ABSTRACT

Multi-pane laminates having electrochromic devices and electromechanical systems, multi-pane window units having electrochromic devices and electromechanical systems, single panes with electrochromic devices and electromechanical systems, and methods of fabricating components thereof.

30 Claims, 10 Drawing Sheets

(51) Int. Cl.
*E06B 3/66* (2006.01)
*E06B 9/24* (2006.01)
*G02B 26/02* (2006.01)
*B32B 17/10* (2006.01)
*G02F 1/15* (2019.01)
*G02B 26/08* (2006.01)

(52) U.S. Cl.
CPC .............. *B81B 7/02* (2013.01); *E06B 3/6612* (2013.01); *E06B 9/24* (2013.01); *G02B 26/02* (2013.01); *G02B 26/023* (2013.01); *B81B 2201/042* (2013.01); *B81B 2201/047* (2013.01); *E06B 2009/2464* (2013.01); *G02B 26/0833* (2013.01); *G02F 1/15* (2013.01)

(58) Field of Classification Search
CPC .......... G02F 1/155; G02F 1/157; G02F 1/161; G02F 2001/1552; G02F 2001/1555
USPC .......................... 359/275, 245, 246, 265, 267
See application file for complete search history.

(56) References Cited

U.S. PATENT DOCUMENTS

| | | | |
|---|---|---|---|
| 8,270,059 B2 * | 9/2012 | Friedman | ................ C03C 17/34 |
| | | | 359/265 |
| 2009/0103166 A1 * | 4/2009 | Khazeni | ............... G02B 26/001 |
| | | | 359/290 |

* cited by examiner

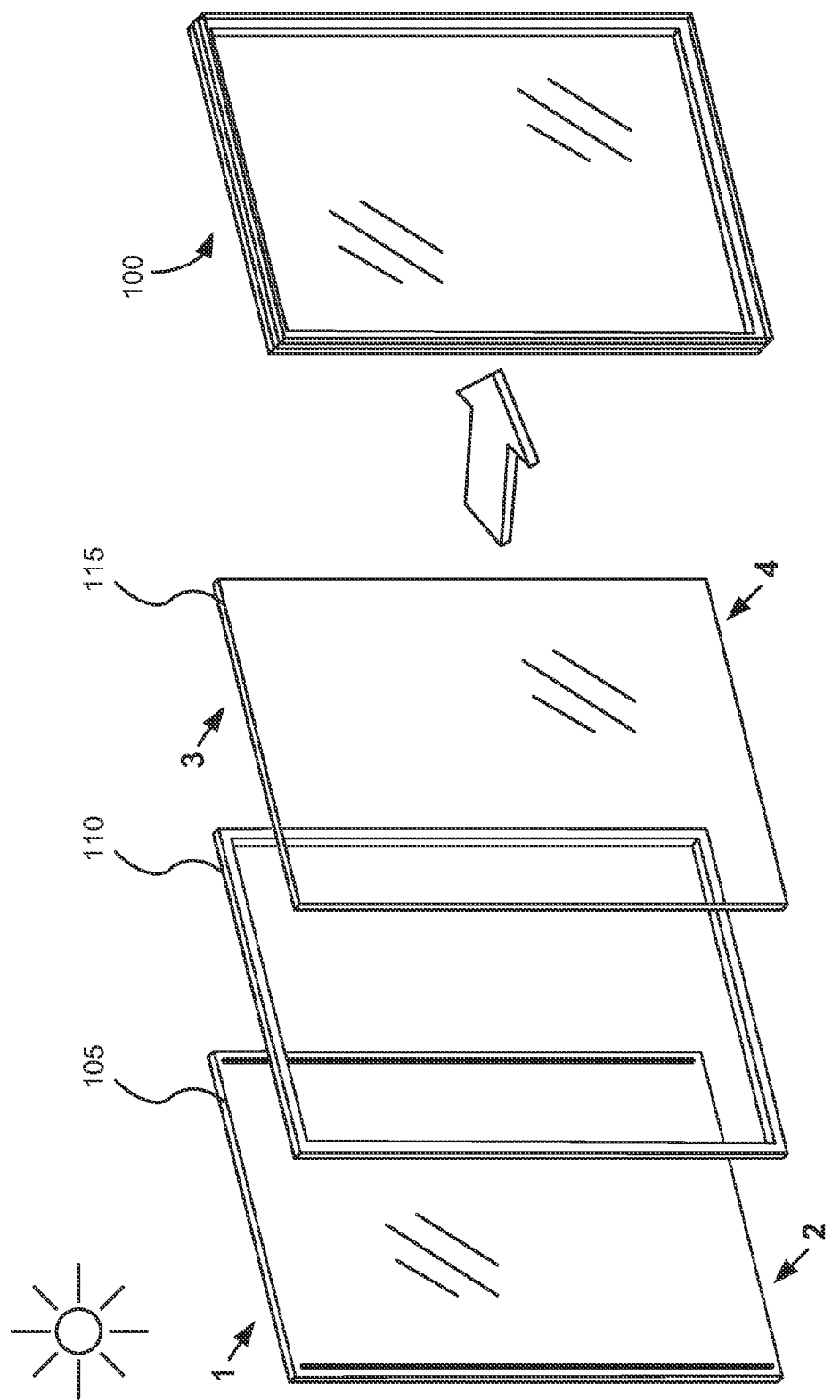

MULTI-PANE WINDOWS INCLUDING ELECTROCHROMIC DEVICES AND ELECTROMECHANICAL SYSTEMS DEVICES

CROSS-REFERENCE TO RELATED APPLICATION

This is a national stage application under 35 U.S.C. § 371 to International Application Number PCT/US2013/072085 (designating the United States), filed on Nov. 26, 2013 and titled "MULTI-PANE WINDOWS INCLUDING ELECTROCHROMIC DEVICES AND ELECTROMECHANICAL SYSTEMS DEVICES," which claims benefit of U.S. Provisional Patent Application No. 61/729,987 titled "MULTI-PANE WINDOWS INCLUDING ELECTROCHROMIC DEVICES AND ELECTROMECHANICAL SYSTEMS DEVICES," filed on Nov. 26, 2012, both of which are hereby incorporated by reference in their entirety and for all purposes.

FIELD OF INVENTION

The invention relates generally to multi-pane windows, and more particularly to multi-pane windows including electrochromic devices and electromechanical systems devices.

BACKGROUND

Electrochromism is a phenomenon in which a material exhibits a reversible electrochemically-mediated change in an optical property when placed in a different electronic state, typically by being subjected to a voltage change. The optical property is typically one or more of color, transmittance, absorbance, and reflectance. One well known electrochromic material, for example, is tungsten oxide ($WO_3$). Tungsten oxide is a cathodic electrochromic material in which a coloration transition, transparent to blue, occurs by electrochemical reduction.

While electrochromism was discovered in the 1960s, electrochromic devices still unfortunately suffer various problems and have not begun to realize their full commercial potential. Electrochromic materials may be incorporated into, for example, windows and mirrors. The color, transmittance, absorbance, and/or reflectance of such windows and mirrors may be changed by inducing a change in the electrochromic material. However, advancements in electrochromic technology, apparatus, and related methods of making and/or using them, are needed because conventional electrochromic windows suffer from, for example, high defectivity, and low versatility.

BRIEF DESCRIPTION OF THE DRAWINGS

The following detailed description can be more fully understood when considered in conjunction with the drawings in which:

FIG. 1 depicts a perspective exploded view of a multi-pane window unit.

SUMMARY

Figure 2A:
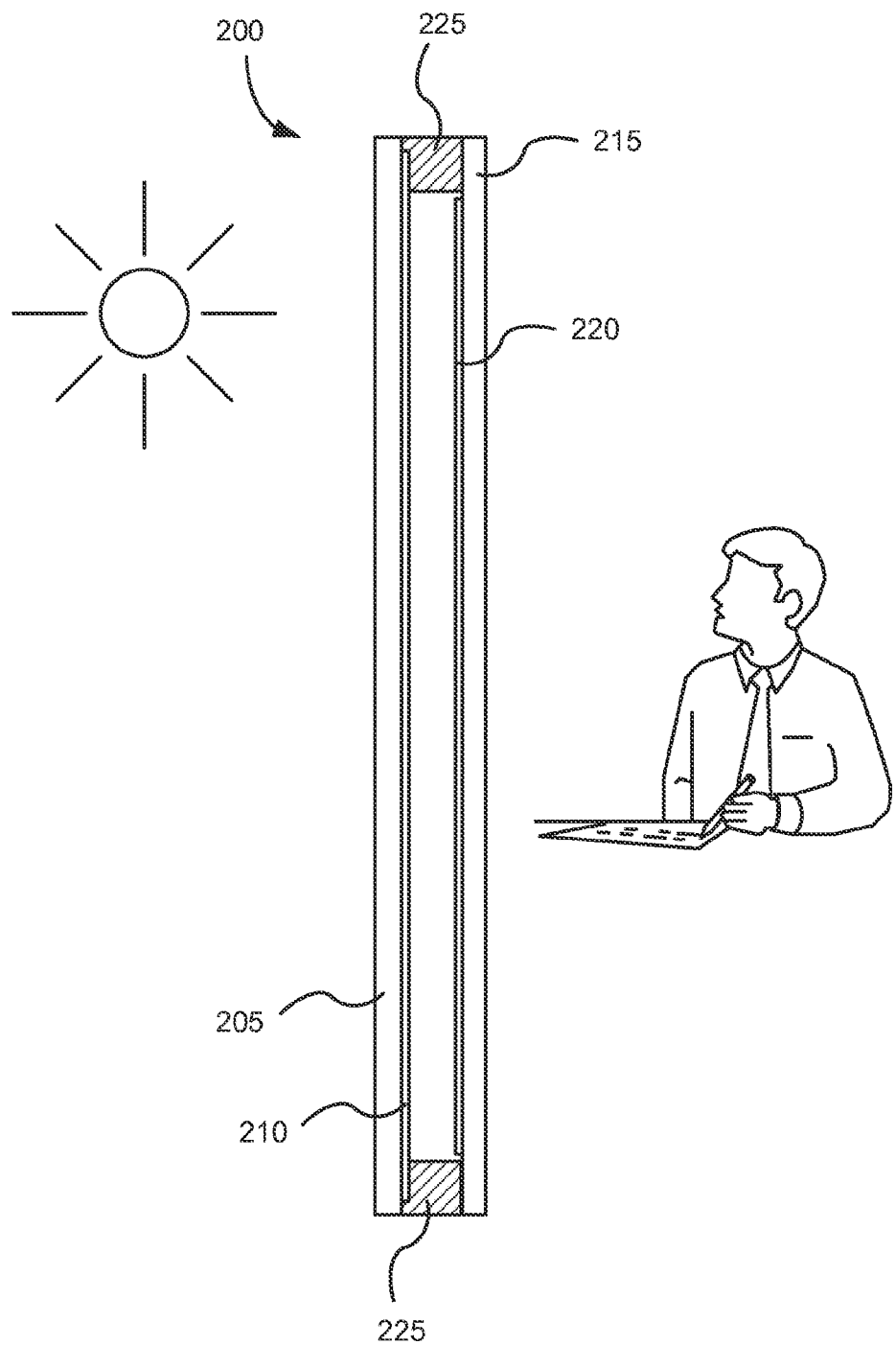
FIG. 2A depicts a cross-section of a multi-pane window unit.

Multi-pane laminates having electrochromic devices and electromechanical systems, multi-pane window units having electrochromic devices and electromechanical systems, single panes having electrochromic devices and electromechanical systems, and methods of fabricating components thereof.

One embodiment is directed to a window unit having a first substantially transparent substrate having an electrochromic device disposed thereon, a second substantially transparent substrate having an array of electromechanical systems devices, and a separator between the first and second substantially transparent substrates. In one case, the separator includes a spacer and a seal between the spacer and each of the first and second substantially transparent substrates to seal an interior region.

One embodiment is directed to an insulating glass unit comprising a first pane having an electrochromic device disposed thereon, a second pane having an array of electromechanical systems devices, and a sealing separator defining, together with the first and second panes, an interior region that is thermally insulating. In one case, the insulating glass unit further comprises a controller configured to control two or more optical states of the electrochromic device and/or to control the actuated and non-actuated states of the array of electromechanical systems devices.

One embodiment is directed to a method of changing between multiple optical states in a window unit including a first substantially transparent substrate having an electrochromic device disposed thereon and a second substantially transparent substrate having an array of electromechanical systems devices. The method comprises changing optical state of the electrochromic device without changing optical state of the array of electromechanical systems devices and changing optical state of the array of electromechanical systems devices without changing optical state of the electrochromic device.

One embodiment is directed to a method of fabricating a window unit. The method comprises arranging, substantially parallel to each other, a first substantially transparent substrate with an electrochromic device disposed thereon and a second substantially transparent substrate with an array of electromechanical systems devices. The method further comprises providing a sealing separator between the first and second substantially transparent substrate.

One embodiment is directed to a method of fabricating an insulating glass unit. The method comprises arranging a first pane of architectural glass and a second pane of architectural glass in a substantially parallel arrangement, wherein the first pane includes an electrochromic device disposed thereon, and the second pane includes an array of electromechanical systems devices, providing a sealing separator between the first and second panes, the sealing separator defining, together with the first and second panes, a thermally-insulating interior region between the first and second panes, and charging the thermally-insulating interior region with an inert gas.

One embodiment is directed to a multi-pane window unit comprising a first pane, a second pane, and an array of electromechanical systems devices disposed on the second pane. The second pane is laminated to the first pane. In one case, the multi-pane window unit further comprises a third pane and a separator between the third pane and the laminated first and second panes. In one case, the electrochromic device has at least two optical states and the array of electromechanical systems devices has two states.

One embodiment is directed to a multi-paned laminate comprising a first pane, a second pane laminated to the first pane, and an array of electromechanical systems devices disposed on an outward facing surface of the second pane. In one case, the second pane is laminated to the first pane with a lamination adhesive therebetween. In one case, the multi-paned laminate further comprises an electrochromic device disposed on the second pane.

Certain embodiments are directed to a substantially transparent substrate comprising a first side, a second side opposing the first side, an electrochromic device disposed on the first side, and an array of electromechanical systems devices disposed on one of the first and second sides. In one case, the array of electromechanical systems devices is disposed on the same side as the electrochromic device. In certain cases, the array of electromechanical systems devices is disposed in tandem with the electrochromic device.

DETAILED DESCRIPTION

Herein are described window units (e.g. certain insulating glass units also referred to as IGUs) that have at least two panes, one pane having an electrochromic device disposed thereon and one pane having an array of microelectromechanical systems (MEMS) devices or other electromechanical systems (EMS) devices disposed thereon. These window units may have at least four optical states. For example, when each pane of the window unit has two optical states, then the window unit may have four optical states. In various embodiments, window units described herein allow the window user a greater choice of how much light is transmitted through the window, that is, the multi-pane window with EMS devices allows a gradation of transmission rather than the two optical states of a simple two-state electrochromic window. In certain embodiments, EMS devices are included with electrochromic devices that can vary light transmission beyond two states. A secondary benefit is the improvement in defectivity due to non-aligned optical defects. Another benefit may be increased speed in transition. Other benefits of certain embodiments are discussed elsewhere in the disclosure.

Certain embodiments are described in relation to low-defectivity all solid state and inorganic electrochromic devices, however, the invention is not limited in this way. Virtually any electrochromic device or devices can be used in combination with virtually any array of MEMS devices or other EMS devices.

Figure 4:
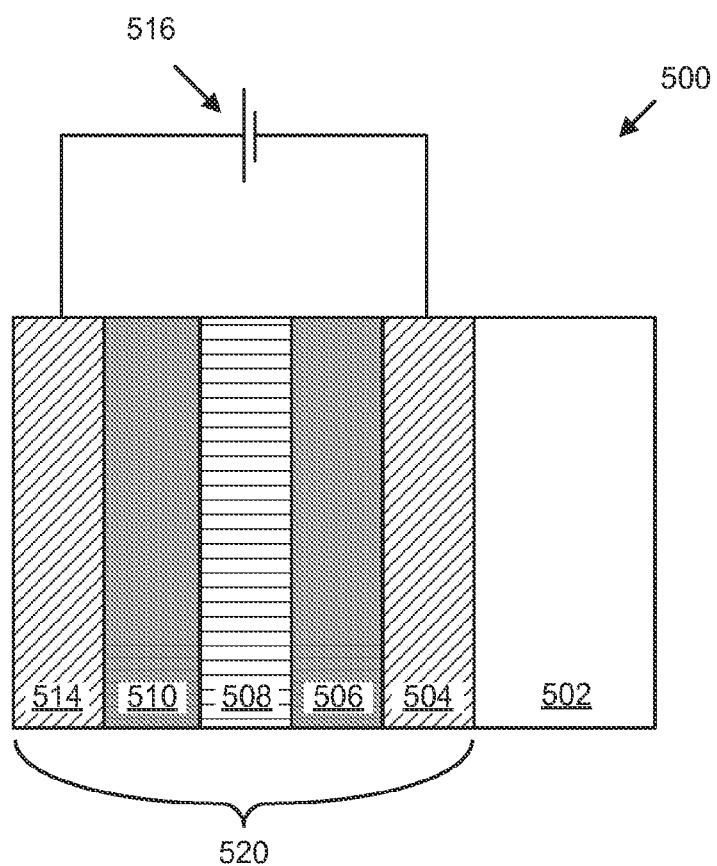
FIG. 4 is a schematic cross-section of an electrochromic device.
Figure 5:
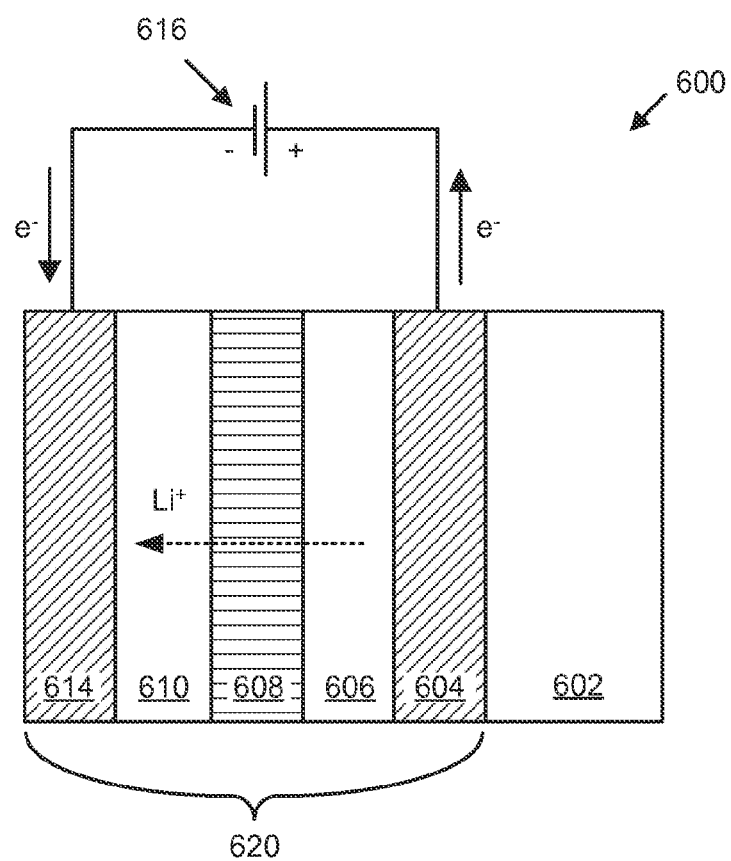
FIG. 5 is a schematic cross-section of an electrochromic device in a bleached state.
Figure 6:
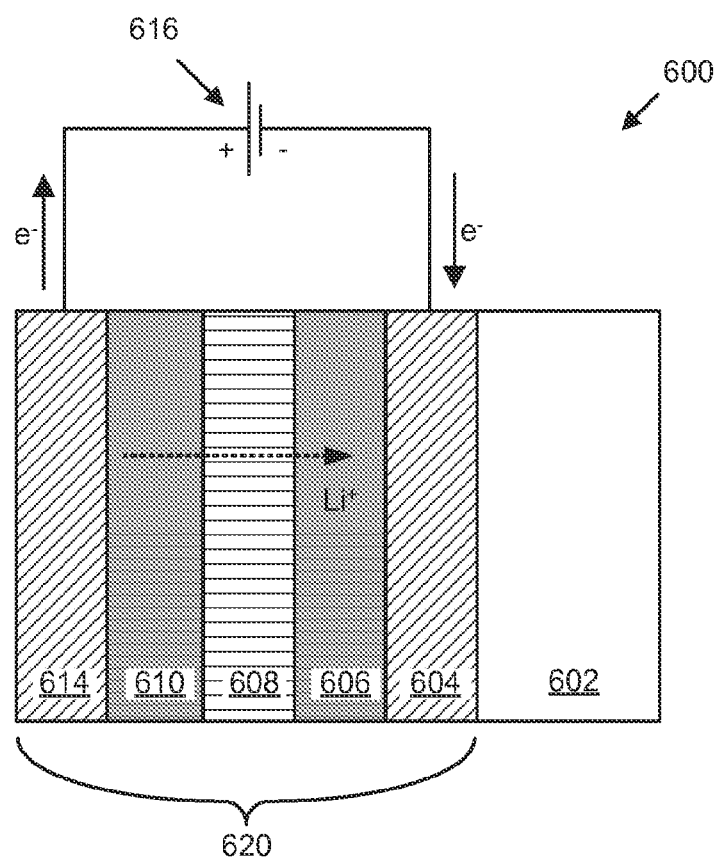
FIG. 6 is a schematic cross-section of an electrochromic device in a colored state.

One of ordinary skill in the art would appreciate that the term "two-state" in two-state electrochromic device refers to the bleached state and the colored state, each of which requires an applied current and/or voltage. In actuality, a two-state electrochromic device will have three states: bleached, colored and neutral. "Neutral" describes the 'natural' state of the window when no charge is applied to either bleach or color the device. For example, FIG. 4 shows a two-state electrochromic device in a neutral state, while FIGS. 5 and 6 show bleached and colored states, respectively. For the purposes of this application, "states" of an electrochromic device are assumed to be colored or bleached states achieved by application of current and/or voltage to the electrochromic device, although neutral states are inherent to electrochromic devices. Although certain embodiments describe two-state electrochromic devices, electrochromic devices with more than two states can be used. For example, electrochromic devices having four or more optical states can be used, these optical states can be distinct end states or the electrochromic device can have variable-state capability.

In certain embodiments, arrays of EMS devices have two states, an actuated state and an unactuated state. In some embodiments, the actuated state may render the array of EMS devices substantially opaque and the unactuated state may render the array of EMS devices substantially transparent, or vice versa. The actuated and unactuated states may also switch between substantially reflective (or absorptive) and substantially transparent, for example. Other states are also possible when the array of EMS devices is in an actuated or unactuated state. For example, microshutters, a type of MEMS device, may be fabricated from a tinted (but non-opaque) coating, which when shut provide a tinted pane, and when open the tint is substantially removed. Further, some arrays of EMS devices may have three, four, or more states that are able to be transitioned to. In some cases, the EMS devices can modify visible and/or infrared transmission. The EMS devices may reflect in some cases, may be absorptive in other cases, and in yet other embodiments may provide both reflective and absorptive properties. In certain embodiments, the EMS devices may be operated at variable speeds, e.g., to transition from a high transmission state to a low-transmission state, or a no-transmission state. In certain cases, the EMS devices may be used in conjunction with an electrochromic device as a temporary light blocking measure, e.g., to block light until the associated electrochromic device has transitioned to a lower transmissivity state or a higher transmissivity state.

Examples of arrays of EMS devices include microblinds and microshutters arranged in an array. Microblinds and microshutters and their methods of fabrication are described respectively in U.S. Pat. Nos. 7,684,105 and 5,579,149, both of which are hereby incorporated by reference in their entirety.

In some embodiments, each EMS device may include a portion attached to the substrate (e.g., a hinge or an anchor) and a mobile portion. When actuated by electrostatic forces, the mobile portion may move and obscure the substrate. In the unactuated state, the mobile portion may expose the substrate. In the example of some microblinds, the mobile portion may be an overhanging portion of a material layer that curls when actuated by electrostatic forces. In the example of some microshutters, the mobile portion can rotate or curl when actuated. In some cases, the EMS devices may be actuated and controlled by electrostatic control means. In the example of microshutters, the electrostatic control means may control the angle of rotation or curl to different states. The substrate with the array of EMS devices may also include a conductive layer. In the example of microblinds, the microblinds are fabricated using a thin layer(s) under controlled stress.

In certain embodiments, the EMS devices may have different power requirements, and in such cases a controller is configured to power and control the EMS devices independently from the electrochromic device. For example, one pane of a window unit or IGU has an electrochromic device coating thereon, and another pane of the same window unit or IGU has an EMS device system thereon. A controller is configured to deliver the powering needs of each lite independently of the other. An electrochromic device may require a few volts to operate, while an EMS device may in some instances require larger voltages in order to establish sufficient potential to physically move the EMS device feature(s) to operate it.

The array of EMS devices may be provided over any suitable portion of the substantially transparent substrate. In many embodiments, the array of EMS devices is provided over the portion of the substantially transparent substrate that receives light.

Multi-pane electrochromic windows are described in U.S. patent application Ser. No. 12/851,514 (now U.S. Pat. No. 8,270,059), entitled "Multi-Pane Electrochromic Windows," filed on Aug. 5, 2010 and naming Robin Friedman et al. as inventors, which is hereby incorporated by reference in its entirety. Aspects of the multi-pane window units disclosed herein, which include an electrochromic device and an array of EMS devices may be similar to the multi-pane electrochromic windows described in the Ser. No. 12/851,514 application.

Multi-Pane Windows

In certain embodiments, a "window unit" can refer to an assembly with one or more substantially transparent substrates (sometimes referred to herein as panes). In one embodiment, a window unit may include two substantially transparent substrates (e.g., two panes of glass) where a first substrate has at least one electrochromic device disposed thereon, and a second substrate has an array of EMS devices disposed thereon. In another embodiment, a window unit may include two substantially transparent substrates where one of the substrates has an electrochromic device disposed on one surface and an array of EMS devices disposed on an opposing surface. In another embodiment, a window unit may include a single substantially transparent substrate having an electrochromic device disposed on one surface and an array of EMS devices disposed on the same or an opposing surface. In yet another embodiment, a window unit may include three substantially transparent substrates. In this embodiment, one or more electrochromic devices may be disposed on surfaces of one or more of the substrates, and an array of EMS devices may be disposed on one or more of the other surfaces that do not have an electrochromic device disposed thereon. In embodiments of window units with multiple panes, certain embodiments may have an array of EMS devices on a surface facing the inside of the building or the room, or facing the interior region of an IGU, for example, in order to protect by the inert dry environment.

In certain embodiments, the substantially transparent substrates of a multi-pane window unit have a separator (sometimes referred to herein as a "spacer") disposed between them. Since an IGU may include more than two substrates assembled into a unit, and electrochromic devices and arrays of EMS devices specifically may include electrical leads for connecting the devices to a voltage source, a current source, switches, and the like, the term "window unit" may be used herein to convey a more simple assembly. That is, for the purposes of this disclosure, an IGU of certain embodiments may include more components than a window unit. In certain embodiments, the most basic assembly of a window unit includes two substrates, each with an electrochromic device thereon, and a sealing separator in between and registered with the two substrates. In one embodiment, an all solid state low-defectivity electrochromic device on a first substrate of a multi-pane window unit and an array of EMS devices on a second substrate of a multi-pane window unit are employed opposing each other in an IGU.

One embodiment is directed to a window unit including: a first substantially transparent substrate and an electrochromic device disposed thereon; a second substantially transparent substrate and an array of EMS devices disposed thereon; and a sealing separator between the first and second substantially transparent substrates, which sealing separator defines, together with the first and second substantially transparent substrates, an interior region that may be thermally insulating. FIG. 1 depicts a window unit, 100, having a first substantially transparent substrate, 105, a separator, 110, and a second substantially transparent substrate, 115. Substrate 105 has an electrochromic device fabricated thereon. Substrate 115 has an array of EMS devices fabricated thereon. When the three components are combined, where separator 110 is sandwiched in between and registered with substrates 105 and 115, window unit 100 is formed. Window unit 100 has an associated interior space defined by the faces of the substrates in contact with the separator and the interior surfaces of the separator. Separator 110 is typically a sealing separator, that is, it includes a spacer and a seal between the spacer and each substrate where they adjoin in order to hermetically seal the interior region for protecting the interior region from moisture intrusion and the like.

As a convention, for two-pane window units described herein, the four viewable surfaces of the two substrates may be referenced numerically. Surface 1 is the surface of a substrate that faces outside, for example, outside a room or a building having such window unit installed in a window in a wall thereof. Surface 2 is the opposing surface of the substrate that faces inside the interior space. Surface 3 is the surface of the second substrate that faces inside the interior space of the window unit. Surface 4 is the opposing surface of the second substrate that faces outside the interior space of the window unit but inside, for example, the aforementioned room or building. This convention does not negate using window units described herein for entirely interior spaces of buildings; however, there are particular advantages to using them on exterior walls of buildings because of their optical as well as thermally-insulating properties.

"Substantially transparent substrates" include those described herein in relation to substrates for electrochromic devices (e.g., solid-state inorganic electrochromic devices) and arrays of EMS devices. That is, they are substantially rigid substrates made of substantially transparent material such as, for example, glass or plexiglass. The substantially transparent substrates of a window unit need not be made of the same material, for example, one substrate may be plastic while the other may be glass. In another example, one substrate may be thinner than the other substrate, for example, the substrate that would face the interior of a structure, which is not exposed to the environment, may be thinner than the substrate that would face the exterior of the structure. In one embodiment, the electrochromic device proximate the exterior environment, for example, the exterior of a building, may be better able to withstand environmental degradation than the array of EMS devices, which are proximate the interior of the building. In one embodiment, at least one of the first and second substantially transparent substrates includes architectural glass. In another embodiment, at least one of the first and second substantially transparent substrates further includes a low emissivity coating. In another embodiment, at least one of the first and second substantially transparent substrates further includes an ultraviolet (UV) and/or infrared (IR) absorber, and/or, a UV and/or IR reflective layer. In one embodiment, the UV and/or IR reflective and/or absorber layer is on at least surface 1, in another embodiment on surface 2, in yet another embodiment on at least surface 3, and in another embodiment on at least surface 4. In these embodiments, "on" a surface means on or associated with, considering that such layers or coatings may be either in direct contact with the surface of the substrate and/or on top of, for example, the EC stack or array of EMS devices that is disposed on the surface of the substrate. One embodiment is any window unit described herein where the electrochromic device has an UV and/or IR absorber and/or a UV and/or IR reflective layer thereon.

The electrochromic device may include one or more transparent conductive oxide layers in some embodiments. In one embodiment, at least one of the transparent conductive oxide layers of the electrochromic device is a heatable transparent conductive oxide layer configured so that it can be heated via application of electricity independently of operation of the electrochromic device of which it is a part. This may be useful for a number of reasons such as, for example, to preheat the electrochromic device prior to transitioning and/or to create an insulating barrier to ameliorate heat loss from the interior of a building. Thus, one embodiment is a window unit as described herein, where the window unit includes an electrochromic device having one or more transparent conductive oxide layers, where one of the transparent conductive oxide layers of the electrochromic device is configured so that it can be heated via application of electricity independently of operation of the electrochromic device of which it is a part. One embodiment is a two-pane window unit as described herein, where on pane has an electrochromic device on its surface facing the interior region (e.g., surface 2) and a transparent conductive oxide layer of the electrochromic device on surface 2, where the transparent conductive oxide layer is configured for heating via application of electricity and where the application of electricity for heating can be independent of operation of the electrochromic device. In certain embodiments, the substrate with EMS devices may have a heatable transparent conductive oxide layer. This may be desirable, e.g., to warm the EMS devices which may improve facile movement of the devices' features.

In one embodiment, the electrochromic device is all solid-state and inorganic, and in another embodiment the electrochromic device is also a low-defectivity device, for example, a low-defectivity all solid-state and inorganic electrochromic device.

The electrochromic device and the array of EMS devices need not necessarily face each other in the interior region of the window unit (for example, on surfaces 2 and 3), but in one embodiment they do. This configuration is desirable because both the electrochromic device and the array of EMS devices are protected from the outside environment and may be in a sealed interior region of the window unit. It is also desirable for the electrochromic device and the array of EMS devices to extend over substantially the entire viewable region of the substantially transparent substrate on which they reside.

FIG. 2A depicts a cross-section of a window unit, 200, which includes a first pane, 205, (e.g., architectural glass pane) with an electrochromic device, 210, disposed thereon. Window unit 200 also includes a second pane, 215, (e.g., architectural glass pane) with an array of EMS devices, 220, disposed thereon. Devices 210 and 220 face each other in the interior region of window unit 200. A sealing separator, 225, seals the window unit, and in this example, overlaps a portion of the electrochromic device. Electrical connections (not shown) might also pass through, or otherwise contact, separator 225. Separator 225 may have a unitary body or may be made of multiple parts, for example, a rigid or semi-rigid spacer and one or more adhesive or other sealing elements. In one example, separator 225 includes a spacer (e.g., a metal spacer) and two seals that seal the areas where the spacer adjoins to each of the panes, sometimes referred to as primary seals, and another seal around the outer perimeter of the spacer, and between the panes, sometimes called a secondary seal, which may be made of, for example, a sealing adhesive. Separator 225 is simplified for the purposes of the illustration in FIG. 2A.

In the stylized figure of FIG. 2A, array of EMS devices 220 is depicted as a single layer that does not touch, or extend under, separator 225. In certain embodiments, the electrochromic device has no moving parts, only ions that move within the EC device during operation. In certain embodiments, the EMS devices have moving parts (e.g., microshutters) that cannot be physically blocked from movement in order to fully operate. In certain embodiments, the array of EMS devices may come very close to the separator, and there may also be a tinted material, in some embodiments the same material coating(s) from which the EMS device array is constructed, around the perimeter of the EMS device array so as to block light around the periphery.

Due to the higher temperatures (e.g., higher temperature due to absorption of radiant energy by an electrochromic device and/or an array of EMS devices on the panes) that multi-pane window units may experience, more robust separators and sealants than those used in conventional IGUs may be used in certain embodiments.

In illustrated examples, sealing separator 225 is disposed about peripheral regions of the first and second substantially transparent substrates without substantially obscuring a viewable region of the window unit (also, for example, as depicted in FIG. 1) away from the peripheral regions. In one embodiment, the sealing separator 225 hermetically seals the interior region of the window unit. The interior region of the window unit is typically, but not necessarily, charged with an inert gas such as argon or nitrogen, xenon, or krypton. In one embodiment, the interior space is substantially liquid free. In one embodiment, the interior space is charged with an inert gas and substantially liquid free. In one embodiment, the interior space is substantially moisture-free, that is, for example, having a moisture content of less than about <0.1 ppm. In another embodiment, the interior space would require at least about −40° C. to reach dew point (condensation of water vapor from the interior space), in another embodiment at least about −70° C. In certain cases, the gas mixture (at pressure or partial vacuum) in the interior region of window unit may be configured to aid in switching of the EMS device array.

Figure 2B:
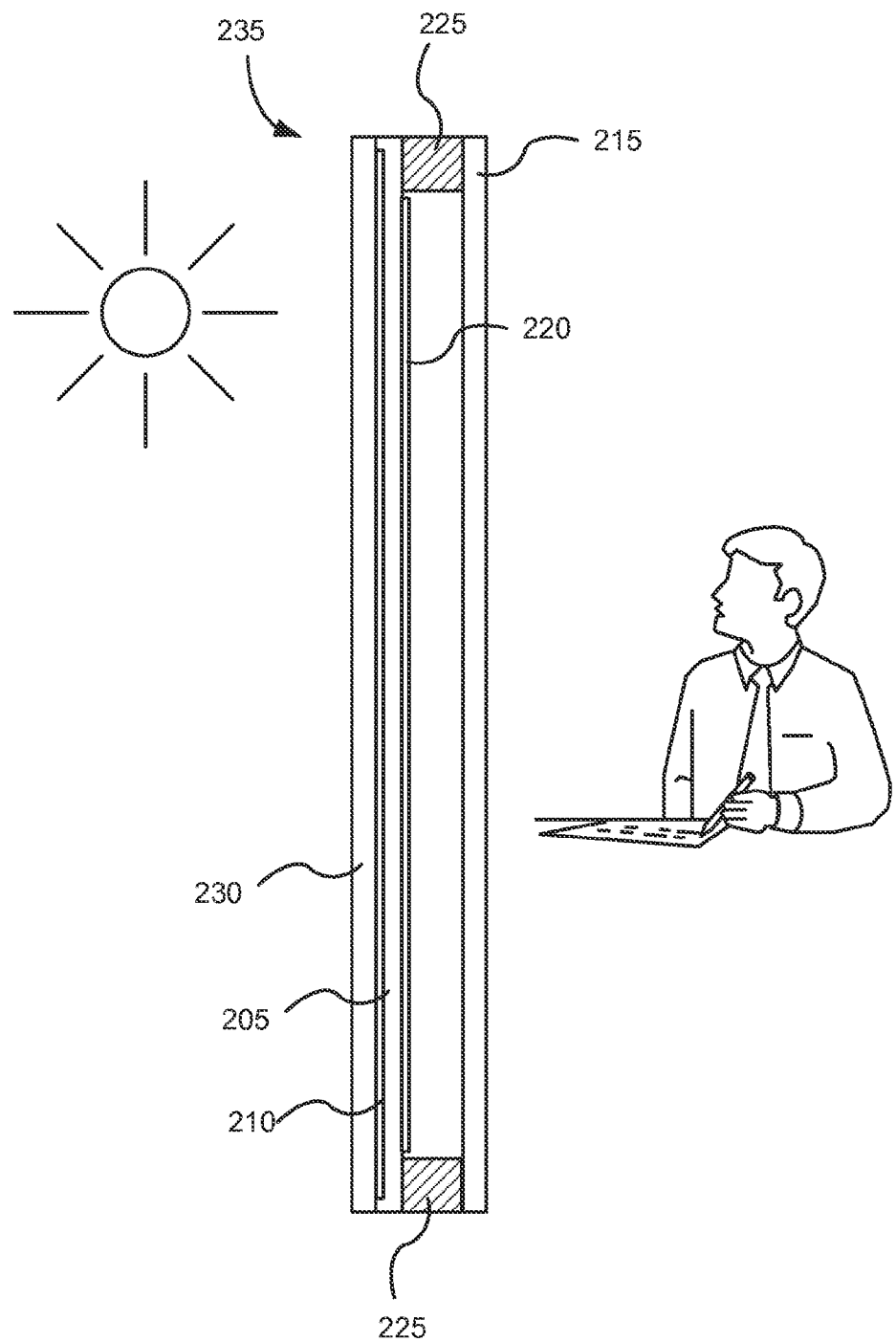
FIGS. 2B and 2C depict cross-sections of multi-pane window units employing laminate panes.

FIG. 2B depicts a cross-section of a window unit, 235, which includes a first pane, 230, with an electrochromic device, 210, disposed thereon. Window unit 235 also includes a second pane, 205, with an array of EMS devices, 220, disposed thereon. In this embodiment, panes 230 and 205 are laminated to each other. Devices 210 and 220 do not face each other, and array of EMS devices 220 is in the interior region of window unit 235. A sealing separator, 225, seals the window unit 235. A third pane, 215, is registered with and opposite of the laminate construct. Third pane 215 may also have a passive or active coating thereon (not shown). Electrical connections (not shown) might also pass through, or otherwise contact, separator 225. Separator 225 may include features as described above in relation to FIG. 2A. Since it is protected by pane 230, pane 205 may be annealed glass (e.g., thin, flexible, annealed glass having a thickness of about 3.2 mm to about 0.05 mm as is commercially available). One advantage of having both an electrochromic device and an array of EMS devices on a single laminate as, for example, depicted in FIG. 2B, is that the construct is less complex, only the outer pane heats up significantly during absorption, and annealed glass, particularly thin annealed glass, can be used as a substrate for the EMS device array. Of course, the construct described in relation to FIG. 2B need not be deployed with the absorptive (laminated) pane on the outward side, instead it may be on an inward side, although the outward side configuration may be desirable in some instances.

One embodiment is directed to a two-paned laminate including an electrochromic device and an EMS device array. In one case, the EMS device array is on a first pane and the electrochromic device is on a second pane, where the electrochromic device is laminated between the panes and the EMS device array is on the surface opposite the lamination adhesive. In another case, the EMS device array is on a first pane and the electrochromic device is on the same first pane, where a second pane is laminated to the first pane, and the electrochromic device is between the panes (touching the lamination adhesive) and the EMS device array is opposite the lamination adhesive.

Another embodiment is a single pane including an EC device on one side and an EMS device array on the opposite side. The side with the EC device may be laminated to another pane. If laminated, the laminate may serve as one pane of a dual or triple pane IGU or window unit. If unlaminated, the single pane may serve as the central pane of a triple pane window unit or IGU.

Certain embodiments are directed to a substantially transparent substrate having an electrochromic device disposed on one side and an array (e.g., one dimensional array or two-dimensional array) of EMS devices disposed on the same or on an opposing side. In one embodiment, this substantially transparent substrate with the electrochromic device and array of EMS devices may be part of a laminate, where an additional transparent substrate is adhered to the side of the substantially transparent substrate bearing the EC device so as to protect it from environment. In this embodiment, the EMS device is housed within the sealed volume of the window unit so as to protect it from the environment. In another embodiment, the substantially transparent substrate with the electrochromic device and array of EMS devices on opposing surfaces may be located within a window unit, e.g. as a middle pane of a triple pane IGU.

Figure 2C:
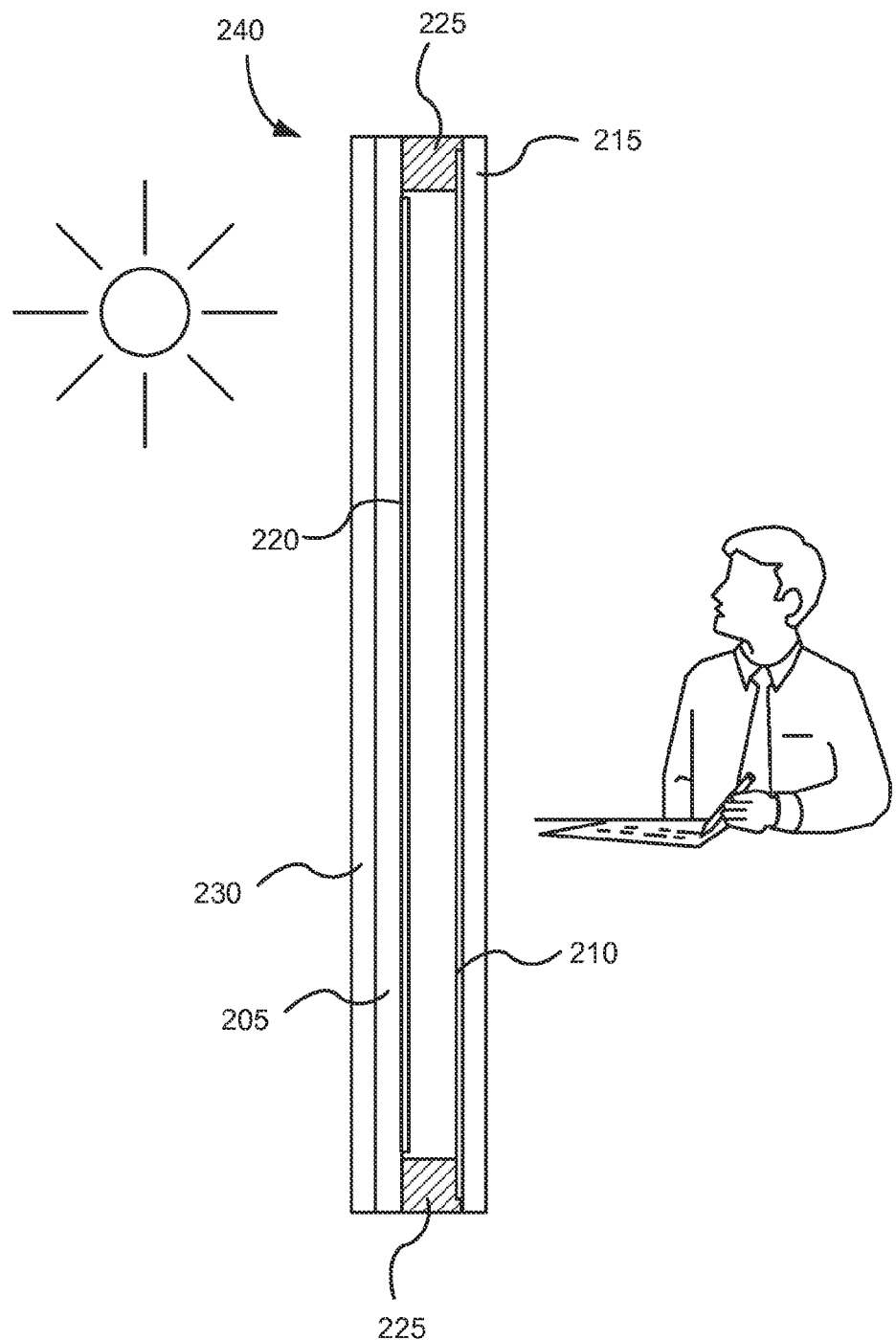

FIG. 2C depicts a cross-section of a window unit, 240, which includes a first pane, 230, laminated to a second pane 205 as described above in relation to FIG. 2B, but in this embodiment, a third pane 215 has an electrochromic device 210 disposed thereon. An array of EMS devices, 220, is disposed on the second pane, 205. Devices 210 and 220 face each other in the interior region of window unit 240. A sealing separator, 225, seals the window unit 240. First pane 230 may also have a passive or active coating thereon in certain cases. Electrical connections (not shown) might also pass through, or otherwise contact, separator 225. Separator 225 may include features as described above in relation to FIG. 2A. Since it is protected by first pane 230, second pane 205 may be annealed glass such as flexible thin annealed glass as may be commercially available and having a thickness of, for example, about 3.2 mm to about 0.05 mm. The construct described in relation to FIG. 2C need not be deployed with the laminated panes outwards. For example, in one embodiment, the construct described in relation to FIG. 2C may be deployed in the opposite orientation so that the electrochromic device's absorptive properties may protect the EMS devices from the sun's radiation.

In certain embodiments, the electrochromic device is a two-state electrochromic device and the array of EMS devices is a two-state array. In these embodiments, the window unit has four optical states. In one such embodiment, the window unit, when mounted, will have a first substantially transparent substrate having a surface facing outside a room or building and a second substantially transparent substrate having a surface facing inside the room or building. In this embodiment, both the electrochromic device and array of EMS devices have their own high transmissive state and low transmissive state and the transmissivity of the low transmissive state of the array of EMS devices' is higher than the transmissivity of the low transmissive state of the electrochromic device. In this context, the transmissivity of the "device," i.e. transmissivity of either the electrochromic device or array of EMS devices, means the transmissivity of either the device itself or the combination of the transmissivity of the device and the substrate upon which the device is disposed upon. That is, for example, most substantially transparent substrates have inherent absorptive properties, for example, float glass alone typically has a transmissivity of about 92%.

One reason that it may be desirable to have transmissivity of the electrochromic device's low transmissive state lower than the transmissivity of the array of EMS device's low transmissive state is that when the electrochromic device is proximate the exterior, it can block more light (and therefore heat) transmission and thus ease the requirements of the array of EMS devices that may be more proximate the interior. For example, the electrochromic device with the higher transmissivity in its low transmissive state can filter out a good portion of the solar spectrum to protect the array of EMS devices from degradation as compared to a device without such protection.

In one embodiment, the array of EMS devices is proximate the exterior and the electrochromic device is proximate the interior. Depending on the material construction of the EMS devices, this configuration may allow the EMS devices array to protect the electrochromic device, and thus work well with a less robust electrochromic device when used in tandem with the EMS device array.

Another advantage to a multi-pane window unit, for example, a two-pane window unit with a device (e.g., electrochromic device or array of EMS devices) on each pane, may be that neither device need have stringent lower transmissivity, for example less than 10% transmissivity, because the net transmissivity through the window unit is a product of both electrochromic device and EMS devices transmissivity. An advantage of having an electrochromic device in addition to EMS devices may be that the electrochromic device can be thinner than it would otherwise be if the window unit had, and relied on, only the electrochromic device. A thinner electrochromic device translates into less materials being used which saves in manufacturing costs. A thinner electrochromic device may also translate into faster response times during transition, which may save operational cost and energy, for example, by using less electricity and controlling heat load entering a room more quickly, and may make a more attractive window for the end user because they absorb less light in the un-tinted state.

Another embodiment is a four-state multi-pane window unit. In one embodiment, the four-state window unit has two panes, one pane with two-state electrochromic device and one pane with a two-state array of EMS devices. By virtue of each pane having a high and a low transmissivity state, when combined, the multi-pane window has four possible states.

Another embodiment is directed to a multi-pane window unit having at least four optical states. This multi-pane window unit has two or more panes. One of the panes has a substantially transparent substrate with an electrochromic device disposed thereon, where the electrochromic device has at least two (e.g., 2, 3, 4, 5, 6, 7, 8, etc.) optical states. The other pane has an array of EMS devices having at least two optical states. When combined, there are at least four possible optical states in this multi-pane window unit.

The transmissivity values of a two-pane window unit of one embodiment are provided in Table 1. In this embodiment, the electrochromic device and the array of EMS devices have two-states, on and off, each corresponding to low and high transmissive states, respectively. For example, the array of EMS devices has a high transmissivity of 80% at a high transmissive state and a low transmissivity of 20% at a low transmissive state, while the electrochromic device has a high transmissivity of 80% at a high transmissive state and a low transmissivity of 10% at a high transmissive state. Since each pane's device has two optical states, that is a high transmissive state and a low transmissive state, when combined in all possible ways, the two-pane window unit has four optical states.

As outlined in Table 1, state 1 exists when the electrochromic device is off and the array of EMS devices is off. Since both devices have an 80% transmissivity when off, the net transmissivity through both panes is 64% (i.e. 80% of 80%). State 2 exists when the array of EMS devices is on but the electrochromic device is off, thus allowing a net transmissivity of 16% (i.e. 20% of 80%). State 3 exists when array of EMS devices is off but the electrochromic device is on, thus allowing a net transmissivity of 8% (i.e. 80% of 10%). State 4 exists when the array of EMS devices is on and the electrochromic device is on, thus allowing a net transmissivity of 2% (i.e. 20% of 10%).

TABLE 1

| State | Array of EMS Devices 80% high (off) 20% low (on) | Electrochromic Device 80% high (off) 10% low (on) | Net Transmissivity |
|---|---|---|---|
| 1 | off | off | 64% |
| 2 | on | off | 16% |
| 3 | off | on | 8% |
| 4 | on | on | 2% |

According to certain embodiments, a four-state multi-pane window may allow a user to choose between four optical states, from high transmissivity (which may be useful when the user wants more light to enter a room) to low transmissivity (which may be useful when the user wants the room dark, for example, during a slide presentation). In addition, the user can also choose two intermediate states of transmissivity, which provides more flexibility than a simple two-state window that is either light or dark i.e., off/on e.g., in a conventional two-state electrochromic window. An advantage of a four-state multi-pane window may be that the EMS array need not be switched as often as it might otherwise be when using other systems.

Another aspect of embodiments disclosed herein is a multi-pane window unit including an electrochromic device and an array of EMS devices, each device on a separate pane of the window unit, where the multi-pane window unit includes a pane that does not have an electrochromic device, but that does include at least a heatable transparent conductive oxide layer (also referred to herein as a heatable TCO). In one embodiment, the "heatable TCO-only" pane of the multi-pane window unit may also include UV/IR absorbing and/or reflecting coatings, lowE coatings, and the like. As described herein, the heatable transparent conductive oxide layer can be heated via, for example, busbars which supply electricity to apply a current and/or voltage through the heatable transparent conductive oxide layer. In one embodiment, the multi-pane window unit has three panes, a first pane with an electrochromic device, a second pane with an array of EMS devices, and a third pane with a heatable transparent conductive oxide layer. Different orders of these panes may be used. In one embodiment, the pane with the electrochromic device may be between the pane with the array of EMS devices and the pane with the heatable TCO. Other orders can be used in other embodiments.

In certain embodiments described here, multi-pane window units include multiple panes designated as "first pane", "second pane," "third pane," etc. Although these designations may define an order of the panes in the window units according to a certain embodiment, other orders may be used in other embodiments. For example, in one embodiment a three-pane window unit may include a first pane, second pane, and third pane, where the second pane is between the first and third panes in the window unit. In another embodiment, the first pane may be between the second and third panes. In yet another embodiment, the third pane may be between the second and first panes.

Figure 3A:
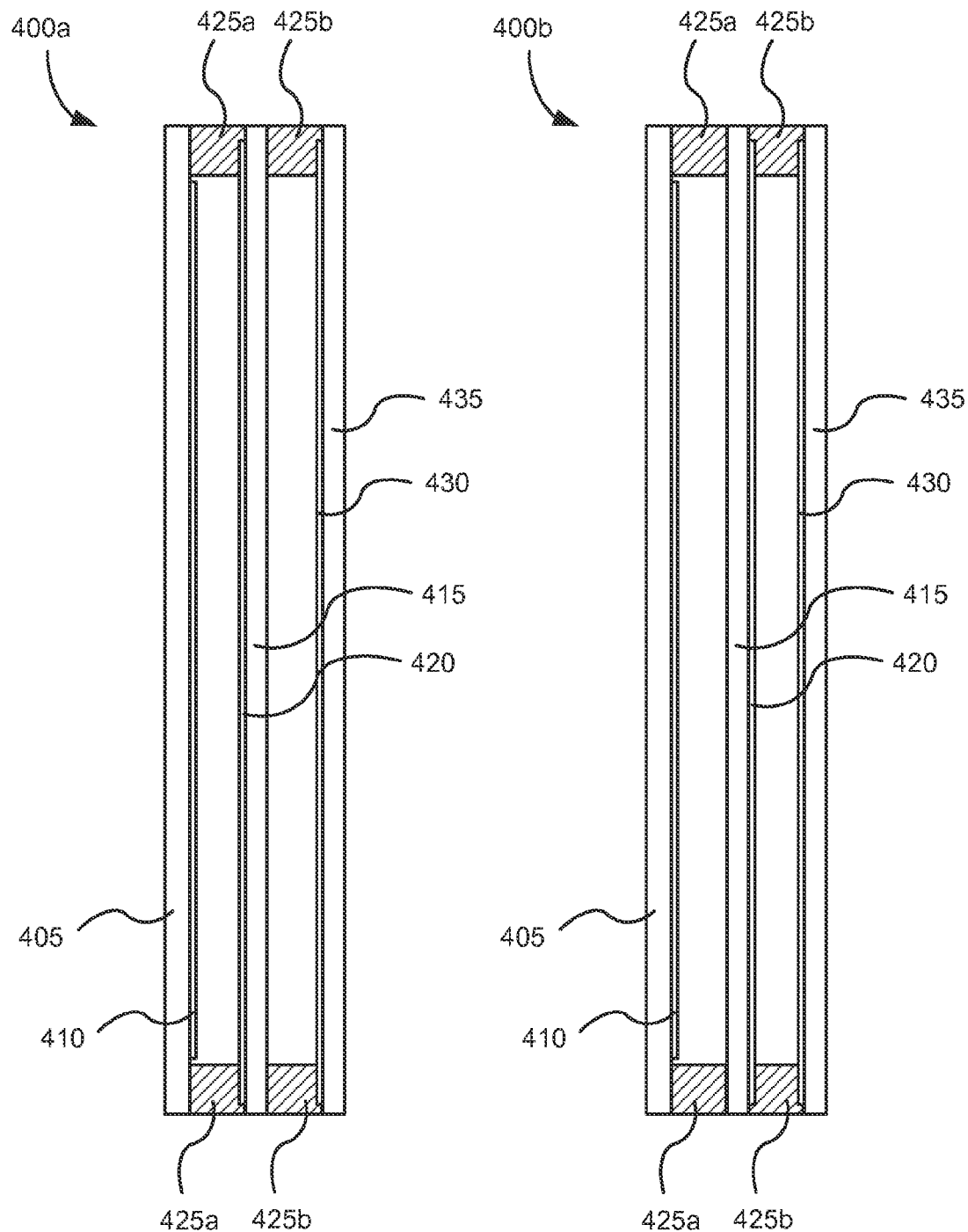
FIG. 3A is a schematic cross-section of a multi-pane window unit.

FIG. 3A illustrates two configurations of a three-pane window unit having an EC pane, an array of EMS devices pane, and a third pane with a heatable TCO. Configuration 400*a* shows a first pane (as described herein) 405, with an array of EMS devices (as described herein), 410. A separator (as described herein), 425*a*, separates and seals a first inner region between pane 405 and pane 415. Pane 415 has an electrochromic device, 420, thereon. A second separator, 425*b*, separates and seals a second inner region, between pane 415 and a third pane, 435, which has a heatable TCO, 430, thereon. In configuration 400*b*, electrochromic device 420 is in the second interior space, opposite and facing TCO 430. One of ordinary skill in the art would appreciate that the electrochromic device or the TCO can be on faces of the panes that are exposed to ambient conditions, rather than an interior region, without escaping the scope of the embodiments disclosed herein.

Another embodiment is three-pane window unit as described in relation to FIG. 3A, but where each of panes 405, 415, and 435 include at least one electrochromic device and at least one array of EMS devices as described herein. In one embodiment, panes 405 and 435 have all solid-state and inorganic electrochromic devices disposed thereon, and pane 415 has an array of EMS devices disposed thereon, wherein the panes may be, for example, either a glass substrate or a polymeric film.

In yet other embodiments, two panes having the electrochromic device and the heatable TCO may be laminated together, either where the two devices face each other and both touch the lamination adhesive, or where only one of the electrochromic device and the heatable TCO touch the lamination adhesive. In yet another embodiment, the electrochromic device or the heatable TCO may be laminated to the backside of the pane bearing the EMS device array. One embodiment is a triple-pane window unit where one of the panes is a laminate structure as described herein, and each of the other two panes of the triple pane window unit are one of an uncoated pane, a pane with a passive coating, a pane with an electrochromic device, a pane with a heatable TCO and a pane with an EMS device array.

One embodiment is a window unit as described herein where at least one of the transparent conductive oxide layers of the electrochromic device is heatable, for example, via application of electricity to resistively heat the TCO. One embodiment is a two-pane window as described herein, where one pane has an electrochromic device on its face in the interior region (surfaces 2 and 3 as described in relation to FIG. 1) and at least one transparent conductive oxide of the electrochromic device is configured for heating via application of electricity, said heating independently of operation of the electrochromic device. When installed in a building where one pane is exposed to the outside and the other exposed to the inside, this heatable TCO can be on the side facing the interior or the exterior of the building.

Another embodiment is a method of changing between multiple optical states in a window unit, including: (i) changing the optical state of an electrochromic device disposed on a first substantially transparent substrate without changing the optical state of an array of EMS devices disposed on a second substantially transparent substrate, where the window unit includes the first and second substantially transparent substrates connected by a sealing separator that defines, together with the first and second substantially transparent substrates, an interior region; and (ii) changing the optical state of the array of EMS devices without changing the optical state of the electrochromic device. This method can further include changing the optical state of the electrochromic device concurrently with changing the optical state of the array of EMS devices. By combining these actions, a window unit has multiple optical states for the end user.

One embodiment is a method of adjusting the transmissivity of an EMS device array on a substantially transparent substrate, the method including, varying the frequency of operation of the EMS device array. In certain embodiments, the EMS array is switched at high frequencies during operation. In other words, rather than a simple "on" or "off" state, the EMS device array's transmissivity is adjusted by tuning the frequency of opening and closing of the EMS devices, e.g., microshutters. In one example, the EMS device array is operated at a frequency in a range between about 10 hertz and about 60 hertz. During operation in this frequency regime, transmissivity at 10 hertz may be about 20% and transmissivity at 60 hertz may be about 50%. In one embodiment, the EMS device array is transitioned from a high frequency state, i.e. at higher transmissivity, to a low frequency state, i.e. at lower transmissivity. This may be used in tandem with an electrochromic device, e.g., in a window unit configuration as described herein.

In one embodiment, the EMS device array, may be used as a temporary light blocking element while the electrochromic device transitions from a first state to a second state. For example, a window unit, such as 200 or 235 described above, is operated in a room where the occupants desire a darkened atmosphere, e.g., when presenting a slide show. For expediency, EMS device array 220 is switched instantly to a low transmissivity state or transitioned quickly to the low transmissivity state, while electrochromic device 210 transitions to a low transimissivity state. Once electrochromic device 210 has completed its transition, then EMS device array 220 is switched to a high transmissivity state, e.g. "open," as it is no longer required to be at a low transimissivity state. Such embodiments may be desirable when, e.g., the electrochromic device transitions slowly, but requires less energy to hold at the low transmissivity state than the EMS device.

One embodiment is a method of fabricating a window unit. The method includes: arranging, substantially parallel to each other, a first substantially transparent substrate with an electrochromic device disposed thereon and a second substantially transparent substrate with an array of EMS devices disposed thereon; and installing a sealing separator between the first and second substantially transparent substrates, where the sealing separator defines, together with the first and second substantially transparent substrates, an interior region, and where the interior region is thermally insulating. In one embodiment, at least one of the first and second substantially transparent substrates includes architectural glass. In one embodiment, at least one of the first and second substantially transparent substrates further includes a low emissivity coating. In another embodiment, both the electrochromic device and the array of EMS devices face the interior region. In one embodiment, at least one of the electrochromic device and array of EMS devices is a two-state device, and in another embodiment, both the electrochromic device and the array of EMS devices are two-state devices and the window unit has four optical states.

Another embodiment is a method of fabricating an IGU, the method including: arranging a first pane of architectural glass and a second pane of architectural glass in a substantially parallel arrangement, where the first pane includes an electrochromic device disposed thereon, and the second pane includes an array of EMS devices disposed thereon; installing a sealing separator between the first and second panes, where the sealing separator defines, together with the first and second panes, an interior region between the first and second panes, where the interior region is thermally insulating; and charging the interior region with an inert gas; where the electrochromic device and the array of EMS devices are in the interior region and are both entirely solid-state and inorganic. In one embodiment, at least one of the first and second panes further includes a low emissivity coating.

Yet other embodiments are directed to methods of fabricating a laminate. These methods include: arranging, substantially parallel to each other, a first substantially transparent substrate with an electrochromic device disposed thereon and a second substantially transparent substrate with an array of EMS devices disposed thereon; laminating the first and second substantially transparent substrates, where the array of EMS devices is on the opposite surface from the lamination adhesive, and the electrochromic device is either facing the lamination adhesive or opposite from it. In one case, tis method further includes receiving a third substantially transparent substrate; registering the third substantially transparent substrate and the laminate; and installing a sealing separator between the laminate and the third substantially transparent substrate, where the sealing separator defines, together with the laminate and the third substantially transparent substrate, a thermally-insulating interior region, to make a window unit. In one embodiment, at least one of the first and second substantially transparent substrates includes architectural glass. In one embodiment, at least one of the first and second substantially transparent substrates further includes a low emissivity coating. In another embodiment, the array of EMS devices faces the interior region. In one embodiment, at least one of the electrochromic devices and the array of EMS devices is a two-state device, and in another embodiment, both the electrochromic device and the array of EMS devices are two-state devices and the window unit has four optical states.

One embodiment is a method of making an EC-EMS device array on a single pane, the method includes fabricating an electrochromic device on one side of a substantially transparent substrate, and fabricating an EMS device array on the other or same side of the substantially transparent substrate. In one embodiment, the electrochromic device is as described herein, and the EMS device array is a microshutter array as described herein.

Embodiments are directed to a substantially transparent substrate having two opposing sides (e.g., a first side and a second side opposing the first side), an electrochromic device disposed on one of the sides, and an array of electromechanical systems devices disposed on the same side or the opposing side. In some cases, the substrate may be laminated to another substantially transparent substrate. In some cases, this substantially transparent substrate may be part of a window unit.

In embodiments where the electrochromic device is deposited on the same side as the electromechanical systems devices, the electrochromic device can be in tandem with the electromechanical systems devices or may be in separate areas of the side. In the tandem construct embodiments, the electromechanical systems devices are located at the uppermost surface to avoid blocking movement of the electromechanical device components. In one tandem embodiment, an intermediate layer may be further included to provide, e.g., good adhesion between the electrochromic device and the electromechanical systems devices and/or insulation between the top conductor layer of the EC device and the conductor(s) of the EMS. The intermediate layer may be, for example, $SiO_2$ or another electrically insulating material to electrically isolate the EC's top conductor from the electromechanical systems devices thereon. In one tandem embodiment, electrochromic device and the electromechanical systems devices are located on a surface 2 of a double-paned insulated glass unit. In certain cases, laser processing can be used to fabricate electrical connectivity/isolation for both devices.

Figure 3B:
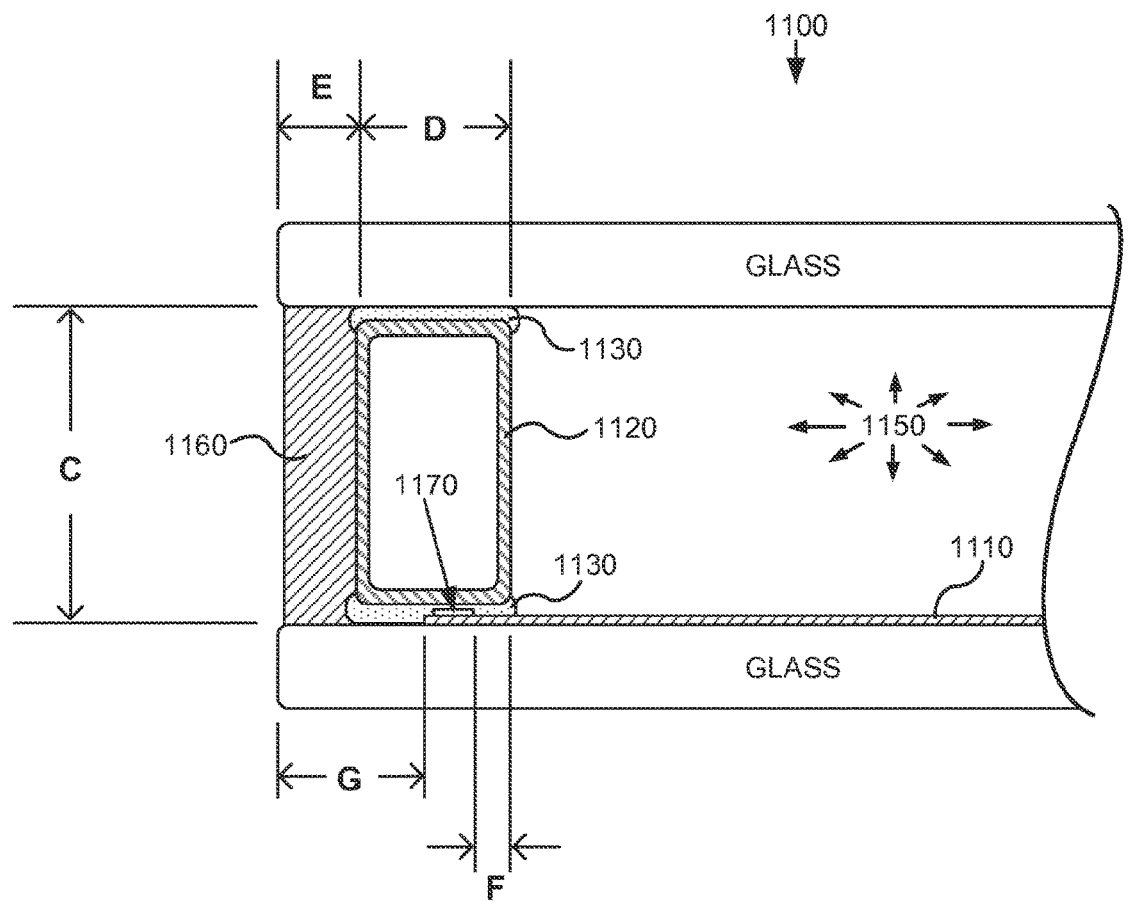
FIG. 3B is a partial cross section of an insulated glass unit showing relative configurations of substrates, electrochromic device, bus bar, spacer, primary seal and the secondary seal.

In certain embodiments, the periphery of the EC device and/or the EMS array are as close to the insulated glass unit spacer(s) as possible so as not to be visible to the end user. That is, isolation scribes, bus bars and associated electrical connections for both the EC device and the EMS device array are preferably hidden from view to the end user. Even more specifically, the electrical connections are made and any isolation cuts (e.g., laser scribes) into the film, bus bars and associated electrical connectors preferably have a small footprint so as to be able to contain it within the area of the secondary seal and/or the spacer of the IGU, but not in the viewable area. FIG. 3B describes such "everything under the spacer" embodiments, in relation to an EC device coating only. It is to be understood that for EMS device arrays, the electromechanical elements cannot be physically blocked from movement, so they are fabricated as close to the spacer as possible without being blocked by it. In certain embodiments, the spacer is a cantilevered spacer that allows the EMS' electromechanical elements to be configured under a cantilevered portion of the spacer so that the entire viewable area is occupied by the EMS device array electromechanical elements. In certain embodiments, e.g. where a non-cantilevered spacer is used, the EMS' electromechanical elements are configured to within 1 mm of the edge of the spacer, in the viewable area of the window unit. FIG. 3B describes a configuration for the EC device for certain embodiments, that is, it is generally preferred to have the EC device periphery under the spacer of an insulated glass unit, since it does not have moving parts. Configuration of the EMS' electromechanical elements will depend on use of a cantilevered spacer. If none is used, the movable elements are preferably configured to within 1 mm of the spacer. A spacer having a curved edge, e.g. as depicted in FIG. 3B, may provide enough cantilever for configuring elements under the edge if the primary sealant does not extend to the inner periphery of the spacer (as in FIG. 3B). If a cantilevered spacer is used, the EMS' device array electrochemical elements may be under the spacer, for example, a distance defined by dimension F as described below in relation to FIG. 3B.

By way of example a tandem EC/EMS device array in a window unit, may be a double-pane insulated glass construct as described in relation to FIG. 3B, where the EMS device array is on the EC device (a tandem construct) or on the opposite pane of the IGU, within the sealed volume of the IGU so as to protect the EMS device array.

FIG. 3B is a partial cross section of an insulated glass unit (IGU), 1100, specifically a portion of IGU 1100 near to and including the edge of the IGU. Insulated glass unit 1100 contains two glass substrates (lites) substantially parallel to each other (see lower portion of FIG. 2B and associated description for general aspects of IGU fabrication). In this example, the lower lite has an EC device, 1110, often referred to as an EC coating. Typically the EC coating is on the order of less than one micron thick to a few microns thick, so this figure is not to scale, i.e. the coating's cross section would not be discernible on this scale (also there may be scribe lines, e.g., proximate the bus bar, but they are not shown). Between the glass lites is a spacer, 1120, which in this example is a metal spacer. Between spacer 1120 and the glass lites is a primary sealant, 1130, for example PIB or other suitable adhesive sealant. This construction is referred to as the primary seal for the IGU; it serves to hermetically seal the interior space, 1150, of the IGU from the ambient, and typically the interior space is charged with an inert gas such as argon. Around the perimeter of the primary seal and between the lites is a sealant, 1160, which forms the secondary seal of the IGU. On EC coating 1110, between spacer 1120 and the lower lite is a bus bar, 1170. Bus bar 1170 could also be on a BPE. The bus bar may be between about 1 mm and about 5 mm wide, typically about 3 mm wide. In this example, spacer 1120 is coated with an insulating material at least on the side proximate bus bar 1170 so as to avoid inadvertent electrical shorting between the metal spacer and the bus bar. In one embodiment, bus bar 1170 overlaps the edge of the EC device along substantially all, or all, of the length of the EC device. That is, the bus bar resides partially on the device and/or BPE area (penetrating type or non-penetrating type) while the other portion of the bus bar, along the length, resides off the device and/or BPE. While not wishing to be bound to theory, it is believed that this configuration may help prevent coloring under the spacer during operation by effectively shorting the device in that area. Spacer 1120 could alternatively be a polymeric spacer or an insulating material could be applied to the bus bar so that a metal spacer would not short on the bus bar. Also, a metal spacer with a channel to accommodate the bus bar would be suitable.

The dimensions, C, D, E, F and G define a number of configurational aspects of embodiments of an IGU for maximizing viewable area while at the same time protecting the edge of the EC device from the ambient in the primary seal. One such embodiment is an IGU having at least one of the dimensions C, D, E, F and G as described below. In one embodiment, the IGU has a configuration that includes all of the dimensions C, D, E, F and G as described below.

The dimension, C, defines the distance between the interior surfaces of the glass lites. Dimension C is commonly measured because, e.g., the glass lites may be of different thickness, so the dimension C would be the same even if the lites were of different thickness. Dimension C is between about 6 mm and about 30 mm, between about 10 mm and about 20 mm, or between about 12 mm and about 13 mm. Dimension C also is a measure of the height of the primary seal and secondary seal. The length of the primary seal and secondary seals will depend on the size of the IGU, as these seals each span a perimeter inside the perimeter of the glass lites of the IGU.

The width of the primary seal approximates, within ±2 mm, the width, D, of spacer 1120, with some variation due to sealant 1130 squeezing out between the spacer and the glass during IGU fabrication (the negative variation is due to some sealant not expanding to the width of the spacer). In one embodiment, the width of the spacer is between about 5 mm and about 15 mm. In another embodiment, the width of the spacer is between about 5 mm and about 10 mm, in another embodiment between about 7 mm and 8 mm.

The distance, E, defines the width of the secondary seal. In one embodiment, the secondary seal is between about 2 mm and about 15 mm wide, in another embodiment between about 3 mm and about 10 mm wide, and in yet another embodiment between about 4 mm and about 8 mm wide. The width of the secondary seal may be set independently of the other dimensions described in relation to FIG. 3B, or, e.g., may be set as an artifact of the choice for dimensions D, F and G. Dimensions F and G are described below.

The distance, F, is the backset, which is the distance between the inner edge of the spacer and the inner edge of a bus bar or a scribe. The backset is a measure of how far "back" a bus bar or scribe is positioned from the inner edge of the spacer, so as to obscure the bus bar and/or scribe from the viewable area of the EC coating. In one embodiment, the backset is between about 1 mm and about 5 mm, in another embodiment, between about 2 mm and about 3 mm, in yet another embodiment about 2 mm. The backset may vary from one side of the IGU to another, as in the described embodiments, the spacer is configured to obscure these features, and these features need not be symmetrically dimensioned with respect to the spacer, the spacer need only obscure them. In other words the backset for a given feature, a scribe line or a bus bar may be different on one side of the IGU as compared to another side of the IGU. FIG. 3B shows that the edge of EC device 1110 is protected by the primary seal. The backset allows any bus bar or scribe line to be obscured and ensures the edge of the EC device is protected by the primary seal.

In one embodiment, the primary seal is a two-part seal. For example the portion of the primary seal that protects the edge of the EC device is a polymeric adhesive seal as depicted, while the outer portion, nearer the outer side of the spacer, where the spacer is over the edge delete area, the seal is a diffusion bonding type seal, where the metal spacer and glass are diffusion bonded on that portion of the spacer.

The distance, G, is a measure of the edge delete as described above. This is the width of the perimeter portion of the EC device removed to expose the glass and/or the diffusion barrier. As described above, in one embodiment, the perimeter portion is between about 1 mm and about 20 mm wide, in another embodiment between about 5 mm and about 15 mm wide, and in yet another embodiment between about 8 mm and about 10 mm wide. In one embodiment the glass is exposed, that is, the EC device and any diffusion barrier are removed in the edge delete. In one embodiment, the edge delete is performed so as to also remove between about 0.5 micrometers ($\mu m$) and about 3 $\mu m$ of the glass substrate, e.g. to ensure complete removal of the EC device and diffusion barrier (accounting for variation in thickness and planarity of the substrate). In one embodiment, the edge delete is performed so as to also remove between about 1 $\mu m$ and about 2 $\mu m$ of the glass substrate. In another embodiment, the edge delete is performed so as to also remove about 1.5 $\mu m$ of the glass substrate.

One embodiment is an IGU where C is between about 12 mm and about 13 mm, D is between about 7 mm and about 8 mm, E is between about 4 mm and about 8 mm, F is between about 2 mm and about 3 mm, and G is between about 8 mm and about 10 mm. In one embodiment, the IGU has two glass panes that are each, independently, between about 3 mm and about 6 mm thick. In one embodiment, the thickness of each of the glass panes is the same. In another embodiment, the thickness of the glass panes does not differ by more than 1 mm.

In certain embodiments having a tandem construct or any combined EC/EMS described herein, a pre-wired spacer could be included that has wiring for one or both devices, whether on one pane or two panes. An example of a pre-wired spacer is described in detail in PCT application Number PCT/US2012/068950, titled "Connectors for Smart Windows," filed on Dec. 11, 2012 and naming Stephen Brown et al. as inventors, which is hereby incorporated by reference in its entirety. For example, in a double pane insulated glass window unit construct, a pre-wired spacer may have electrical wiring and/or contacts configured to deliver electricity to one or both of the EC device and the EMS device array, whether they are on the same pane of glass or different panes of glass.

Low-Defectivity Solid-State and Inorganic Electrochromic Devices Having Distinct Layers FIG. 4 depicts a schematic cross-section of an electrochromic device, 500. Electrochromic device 500 includes a substrate, 502 (e.g., a substantially transparent substrate), a conductive layer, 504, an electrochromic layer, 506, an ion conducting layer, 508, a counter electrode layer, 510, and a conductive layer, 514. Layers 504, 506, 508, 510, and 514 are collectively referred to as an electrochromic stack, 520. A voltage source, 516, operable to apply an electric potential across electrochromic stack 520, effects the transition of the electrochromic device from, for example, a bleached state to a colored state (depicted). The order of layers can be reversed with respect to the substrate.

In certain embodiments, electrochromic devices having distinct layers as described herein can be fabricated as all solid-state and inorganic devices with low defectivity. Such all solid-state and inorganic electrochromic devices, and methods of fabricating them, are described in more detail in U.S. patent application Ser. No. 12/645,111, titled "Fabrication of Low-Defectivity Electrochromic Devices," filed on Dec. 22, 2009 and naming Mark Kozlowski et al. as inventors, and in U.S. patent application Ser. No. 12/645,159 (now U.S. Pat. No. 8,432,603), titled "Electrochromic Devices," filed on Dec. 22, 2009 and naming Zhongchun Wang et al. as inventors, both of which are hereby incorporated by reference in their entirety.

It should be understood that reference to a transition between a bleached state and colored state is non-limiting and suggests only one example, among many, of an electrochromic transition that may be implemented. Unless otherwise specified herein, whenever reference is made to a bleached-colored transition, the corresponding device or process encompasses other optical state transitions such as non-reflective-reflective, transparent-opaque, etc. Further the term "bleached" refers to an optically neutral state, for example, uncolored, transparent, or translucent. Still further, unless specified otherwise herein, the "color" of an electrochromic transition is not limited to any particular wavelength or range of wavelengths. As understood by those of skill in the art, the choice of appropriate electrochromic and counter-electrode materials governs the relevant optical transition.

In certain embodiments, the electrochromic device reversibly cycles between a bleached state and a colored state. In the bleached state, a potential is applied to the electrochromic stack 520 such that available ions in the stack that can cause the electrochromic material 506 to be in the colored state reside primarily in the counter electrode 510. When the potential on the electrochromic stack is reversed, the ions are transported across the ion conducting layer 508 to the electrochromic material 506 and cause the material to enter the colored state. A more detailed description of the transition from bleached to colored state, and from colored to bleached state, is described below.

In certain embodiments, all of the materials making up electrochromic stack 520 are inorganic, solid (that is, in the solid state), or both inorganic and solid. Because organic materials tend to degrade over time, using inorganic materials may offer the advantage of a more reliable electrochromic stack that may be able to function for extended periods of time. Materials in the solid-state may also offer the advantage of not having containment and leakage issues, as materials in the liquid state often do. Each of the layers in the electrochromic device is discussed in detail below. It should be understood that any one or more of the layers in the electrochromic stack may contain some amount of organic material, but in many implementations one or more of the layers contains little or no organic matter. The same can be said for liquids that may be present in one or more layers in small amounts. It should also be understood that solid-state material may be deposited or otherwise formed by processes employing liquid components such as certain processes employing sol-gels or chemical vapor deposition.

Referring again to FIG. 4, voltage source 516 is typically a low voltage electrical source and may be configured to operate in conjunction with radiant and other environmental sensors. Voltage source 516 may also be configured to interface with an energy management system, such as a computer system that controls the electrochromic device and array of EMS devices according to factors such as the time of year, time of day, and measured environmental conditions. Such an energy management system, in conjunction with large area electrochromic devices and large area arrays of EMS devices (that is, a multi-pane window as described herein), can dramatically lower the energy consumption of a building. As will be apparent from the description of multi-pane windows described herein, particular energy savings on heating and cooling are realized.

Any material having suitable optical, electrical, thermal, and mechanical properties may be used as substrate 502. Such substrates include, for example, glass, plastic, and mirror materials. Suitable plastic substrates include, for example acrylic, polystyrene, polycarbonate, allyl diglycol carbonate, SAN (styrene acrylonitrile copolymer), poly(4-methyl-1-pentene), polyester, polyamide, etc. If a plastic substrate is used, it is preferably barrier protected and abrasion protected using a hard coat of, for example, a diamond-like protection coating, a silica/silicone anti-abrasion coating, or the like, such as is well known in the plastic glazing art. Suitable glasses include either clear or tinted soda lime glass, including soda lime float glass. The glass may be tempered or untempered. In some embodiments of electrochromic device 500 with glass, for example soda lime glass, used as substrate 502, there is a sodium diffusion barrier layer (not shown) between substrate 502 and conductive layer 504 to prevent the diffusion of sodium ions from the glass into conductive layer 504.

In some embodiments, the optical transmittance (that is, the ratio of transmitted radiation or spectrum to incident radiation or spectrum) or "transmissivity" of substrate 502 (or other substrates described herein) is about 40 to 95%, for example, about 90 to 92%. The substrate 502 may be of any thickness, as long as it has suitable mechanical properties to support the electrochromic stack 520. While substrate 502 (or other substrates described herein) may be of virtually any suitable thickness, in some embodiments, it is about 0.01 mm to 10 mm thick, preferably about 3 mm to 9 mm thick. Multi-pane window units described herein may have individual panes of different thickness. In one embodiment, an inner (proximate to the interior of a structure) pane is thinner than an outer (proximate to the external environment) pane that must withstand more extreme exposure.

In some embodiments, the substrate is architectural glass. Architectural glass is glass that can be used as a building material. Architectural glass is typically used in commercial buildings, but may also be used in residential buildings, and typically, although not necessarily, separates an indoor environment from an outdoor environment. In certain embodiments, architectural glass has a size of at least 20 inches by 20 inches, and can be much larger, for example, as large as about 72 inches by 120 inches. Architectural glass is typically at least about 2 mm thick. Architectural glass that is less than about 3.2 mm thick cannot be tempered. In some embodiments with architectural glass as the substrate, the substrate may still be tempered even after the electrochromic stack has been fabricated on the substrate. In some embodiments with architectural glass as the substrate, the substrate is a soda lime glass from a tin float line. The percent transmission over the visible spectrum of an architectural glass substrate (that is, the integrated transmission across the visible spectrum) is generally greater than 80% for neutral substrates, but it could be lower for colored substrates. Preferably, the percent transmission of the substrate over the visible spectrum is at least about 90% (for example, in the range of about 90% to about 92%). The visible spectrum is the spectrum that a typical human eye will respond to, which is generally about 380 nm (purple) to about 780 nm (red). In some cases, the glass has a surface roughness of between about 10 nm and about 30 nm.

On top of substrate 502 is conductive layer 504. In certain embodiments, one or both of the conductive layers 504 and 514 is inorganic and/or solid-state. Conductive layers 504 and 514 may be made from a number of different materials, including conductive oxides, thin metallic coatings, conductive metal nitrides, and composite conductors. Typically, conductive layers 504 and 514 are transparent at least in the range of wavelengths where electrochromism is exhibited by the electrochromic layer. Transparent conductive oxides include metal oxides and metal oxides doped with one or more metals. Examples of such metal oxides and doped metal oxides include indium oxide, indium tin oxide, doped indium oxide, tin oxide, doped tin oxide, zinc oxide, aluminum zinc oxide, doped zinc oxide, ruthenium oxide, doped ruthenium oxide, and the like. Since oxides are often used for these layers, they are sometimes referred to as "transparent conductive oxide" (TCO) layers. Thin metallic coatings that are substantially transparent may also be used. Examples of metals used for such thin metallic coatings include transition metals including gold, platinum, silver, aluminum, nickel alloy, and the like. Thin metallic coatings based on silver, well known in the glazing industry, are also used. Examples of conductive nitrides include titanium nitrides, tantalum nitrides, titanium oxynitrides, and tantalum oxynitrides. The conductive layers 504 and 514 may also be composite conductors. Such composite conductors may be fabricated by placing highly conductive ceramic and metal wires or conductive layer patterns on one of the faces of the substrate and then over-coating with transparent conductive materials such as doped tin oxides or indium tin oxide. Ideally, such wires should be thin enough as to be invisible to the naked eye (for example, about 100 µm or thinner).

In some embodiments, commercially-available substrates such as glass substrates contain a transparent conductive layer coating. Such products may be used for both substrate 502 and conductive layer 504. Examples of such glasses include conductive layer coated glasses sold under the trademark TEC Glass™ by Pilkington of Toledo, Ohio, and SUNGATE™ 300 and SUNGATE™ 500 by PPG Industries of Pittsburgh, Pa. TEC Glass™ is a glass coated with a fluorinated tin oxide conductive layer. Indium tin oxide is also a commonly used substantially transparent conductive layer.

In some embodiments, the same conductive material is used for both conductive layers (that is, conductive layers 504 and 514). In some embodiments, different conductive materials are used for each conductive layer 504 and 514. For example, in some embodiments, TEC Glass™ is used for substrate 502 (float glass) and conductive layer 504 (fluorinated tin oxide) and indium tin oxide is used for conductive layer 514. As noted above, in some embodiments employing TEC Glass™, there is a sodium diffusion barrier between the glass substrate 502 and TEC conductive layer 504 because float glass may have high sodium content.

In some implementations, the composition of a conductive layer, as provided for fabrication, should be chosen or tailored based on the composition of an adjacent layer (for example, electrochromic layer 506 or counter electrode layer 510) in contact with the conductive layer. For metal oxide conductive layers, for example, conductivity is a function of the number of oxygen vacancies in the conductive layer material, and the number of oxygen vacancies in the metal oxide is impacted by the composition of the adjacent layer. Selection criteria for a conductive layer may also include the material's electrochemical stability and ability to avoid oxidation or more commonly reduction by a mobile ion species.

The function of the conductive layers is to spread an electric potential provided by voltage source 516 over surfaces of the electrochromic stack 520 to interior regions of the stack, with very little ohmic potential drop. The electric potential is transferred to the conductive layers though electrical connections to the conductive layers. In some embodiments, bus bars, one in contact with conductive layer 504 and one in contact with conductive layer 514, provide the electric connection between the voltage source 516 and the conductive layers 504 and 514. The conductive layers 504 and 514 may also be connected to the voltage source 516 with other conventional means.

In some embodiments, the thickness of conductive layers 504 and 514 is between about 5 nm and about 10,000 nm. In some embodiments, the thickness of conductive layers 504 and 514 is between about 10 nm and about 1,000 nm. In other embodiments, the thickness of conductive layers 504 and 514 is between about 10 nm and about 500 nm. In some embodiments, where TEC Glass™ is used for substrate 502 and conductive layer 504, the conductive layer is about 400 nm thick. In some embodiments where indium tin oxide is used for conductive layer 514, the conductive layer is about 100 nm to 400 nm thick (280 nm in one embodiment). More generally, thicker layers of the conductive material may be employed so long as they provide the necessary electrical properties (for example, conductivity) and optical properties (for example, transmittance). Generally, the conductive layers 504 and 514 are as thin as possible to increase transparency and to reduce cost. In some embodiment, conductive layers are substantially crystalline. In some embodiments, conductive layers are crystalline with a high fraction of large equiaxed grains.

The thickness of the each conductive layer 504 and 514 is also substantially uniform. Smooth layers (that is, low roughness, Ra) of the conductive layer 504 are desirable so that other layers of the electrochromic stack 520 are more compliant. In one embodiment, a substantially uniform conductive layer varies by no more than about ±10% in each of the aforementioned thickness ranges. In another embodiment, a substantially uniform conductive layer varies by no more than about ±5% in each of the aforementioned thickness ranges. In another embodiment, a substantially uniform conductive layer varies by no more than about ±2% in each of the aforementioned thickness ranges.

The sheet resistance ($R_s$) of the conductive layers is also important because of the relatively large area spanned by the layers. In some embodiments, the sheet resistance of conductive layers 504 and 514 is between about 5 Ohms per square to about 30 Ohms per square. In some embodiments, the sheet resistance of conductive layers 504 and 514 is about 15 Ohms per square. In general, it is desirable that the sheet resistance of each of the two conductive layers be about the same. In one embodiment, the two layers each have a sheet resistance of between about 10 Ohms per square and about 15 Ohms per square.

Overlaying conductive layer 504 is electrochromic layer 506 in FIG. 4. In embodiments, electrochromic layer 506 is inorganic and/or solid-state, in typical embodiments inorganic and solid-state. The electrochromic layer may contain any one or more of a number of different electrochromic materials, including metal oxides. Such metal oxides include tungsten oxide ($WO_3$), molybdenum oxide ($MoO_3$), niobium oxide ($Nb_2O_5$), titanium oxide ($TiO_2$), copper oxide (CuO), iridium oxide ($Ir_2O_3$), chromium oxide ($Cr_2O_3$), manganese oxide ($Mn_2O_3$), vanadium oxide ($V_2O_5$), nickel oxide ($Ni_2O_3$), cobalt oxide ($Co_2O_3$), and the like. In some embodiments, the metal oxide is doped with one or more dopants such as lithium, sodium, potassium, molybdenum, vanadium, titanium, and/or other suitable metals or compounds containing metals. Mixed oxides (for example, W—Mo oxide, W—V oxide) are also used in certain embodiments. An electrochromic layer 506 comprising a metal oxide is capable of receiving ions transferred from counter electrode layer 510.

In some embodiments, tungsten oxide or doped tungsten oxide is used for electrochromic layer 506. In one embodiment, the electrochromic layer is made substantially of $WO_x$, where "x" refers to an atomic ratio of oxygen to tungsten in the electrochromic layer, and x is between about 2.7 and 3.5. It has been suggested that only sub-stoichiometric tungsten oxide exhibits electrochromism; that is, stoichiometric tungsten oxide, $WO_3$, does not exhibit electrochromism. In a more specific embodiment, $WO_x$, where x is less than 3.0 and at least about 2.7 is used for the electrochromic layer. In another embodiment, the electrochromic layer is $WO_x$, where x is between about 2.7 and about 2.9. Techniques such as Rutherford Backscattering Spectroscopy (RBS) can identify the total number of oxygen atoms which include those bonded to tungsten and those not bonded to tungsten. In some instances, tungsten oxide layers where x is 3 or greater exhibit electrochromism, presumably due to unbound excess oxygen along with sub-stoichiometric tungsten oxide. In another embodiment, the tungsten oxide layer has stoichiometric or greater oxygen, where x is 3.0 to about 3.5.

In certain embodiments, the tungsten oxide is crystalline, nanocrystalline, or amorphous. In some embodiments, the tungsten oxide is substantially nanocrystalline, with grain sizes, on average, from about 5 nm to about 50 nm (or from about 5 nm to about 20 nm), as characterized by transmission electron microscopy (TEM). The tungsten oxide morphology may also be characterized as nanocrystalline using x-ray diffraction (XRD). For example, nanocrystalline electrochromic tungsten oxide may be characterized by the following XRD features: a crystal size of about 10 nm to about 100 nm (for example, about 55 nm). Further, nanocrystalline tungsten oxide may exhibit limited long range order, for example, on the order of several (about 5 to about 20) tungsten oxide unit cells.

The thickness of the electrochromic layer 506 depends on the electrochromic material selected for the electrochromic layer. In some embodiments, the electrochromic layer 506 is about 50 nm to 2,000 nm thick, or about 200 nm to 700 nm thick. In some embodiments, the electrochromic layer is about 300 nm to about 500 nm thick. The thickness of the electrochromic layer 506 is also substantially uniform. In one embodiment, a substantially uniform electrochromic layer varies only about ±10% in each of the aforementioned thickness ranges. In another embodiment, a substantially uniform electrochromic layer varies only about ±5% in each of the aforementioned thickness ranges. In another embodiment, a substantially uniform electrochromic layer varies only about ±3% in each of the aforementioned thickness ranges.

Generally, in electrochromic materials, the colorization (or change in any optical property—for example, absorbance, reflectance, and transmittance) of the electrochromic material is caused by reversible ion insertion into the material (for example, intercalation) and a corresponding injection of a charge balancing electron. Typically, some fraction of the ion responsible for the optical transition is irreversibly bound up in the electrochromic material. As explained below, some or all of the irreversibly bound ions are used to compensate "blind charge" in the material. In most electrochromic materials, suitable ions include lithium ions ($Li^+$) and hydrogen ions ($H^+$) (that is, protons). In some cases, however, other ions will be suitable. These include, for example, deuterium ions ($D^+$), sodium ions ($Na^+$), potassium ions ($K^+$), calcium ions ($Ca^{++}$), barium ions ($Ba^{++}$), strontium ions ($Sr^{++}$), and magnesium ions ($Mg^{++}$). In various embodiments described herein, lithium ions are used to produce the electrochromic phenomena. Intercalation of lithium ions into tungsten oxide ($WO_{3-y}$ ($0<y\leq\sim0.3$)) causes the tungsten oxide to change from transparent (bleached state) to blue (colored state).

Referring again to FIG. 4, in electrochromic stack 520, ion conducting layer 508 overlays electrochromic layer 506. On top of ion conducting layer 508 is counter electrode layer 510. In some embodiments, counter electrode layer 510 is inorganic and/or solid. The counter electrode layer may comprise one or more of a number of different materials that are capable of serving as reservoirs of ions when the electrochromic device is in the bleached state. During an electrochromic transition initiated by, for example, application of an appropriate electric potential, the counter electrode layer transfers some or all of the ions it holds to the electrochromic layer, changing the electrochromic layer to the colored state. Concurrently, in the case of NiWO, the counter electrode layer colors with the loss of ions.

In some embodiments, suitable materials for the counter electrode complementary to $WO_3$ include nickel oxide (NiO), nickel tungsten oxide (NiWO), nickel vanadium oxide, nickel chromium oxide, nickel aluminum oxide, nickel manganese oxide, nickel magnesium oxide, chromium oxide ($Cr_2O_3$), manganese oxide ($MnO_2$), and Prussian blue. Optically passive counter electrodes comprise cerium titanium oxide ($CeO_2$—$TiO_2$), cerium zirconium oxide ($CeO_2$—$ZrO_2$), nickel oxide (NiO), nickel-tungsten oxide (NiWO), vanadium oxide ($V_2O_5$), and mixtures of oxides (for example, a mixture of $Ni_2O_3$ and $WO_3$). Doped formulations of these oxides may also be used, with dopants including, for example, tantalum and tungsten. Because counter electrode layer 510 contains the ions used to produce the electrochromic phenomenon in the electrochromic material when the electrochromic material is in the bleached state, the counter electrode preferably has high transmittance and a neutral color when it holds significant quantities of these ions.

In some embodiments, nickel-tungsten oxide (NiWO) is used in the counter electrode layer. In certain embodiments, the amount of nickel present in the nickel-tungsten oxide can be up to about 90% by weight of the nickel-tungsten oxide. In a specific embodiment, the mass ratio of nickel to tungsten in the nickel-tungsten oxide is between about 4:6 and 6:4 (for example, about 1:1). In one embodiment, the NiWO is between about 15% (atomic) Ni and about 60% Ni; between about 10% W and about 40% W; and between about 30% O and about 75% O. In another embodiment, the NiWO is between about 30% (atomic) Ni and about 45% Ni; between about 10% W and about 25% W; and between about 35% O and about 50% O. In one embodiment, the NiWO is about 42% (atomic) Ni, about 14% W, and about 44% O.

When charge is removed from a counter electrode 510 made of nickel tungsten oxide (that is, ions are transported from the counter electrode 510 to the electrochromic layer 506), the counter electrode layer will turn from a transparent state to a brown colored state.

The counter electrode morphology may be crystalline, nanocrystalline, or amorphous. In some embodiments, where the counter electrode layer is nickel-tungsten oxide, the counter electrode material is amorphous or substantially amorphous. Substantially amorphous nickel-tungsten oxide counter electrodes have been found to perform better, under some conditions, in comparison to their crystalline counterparts. The amorphous state of the nickel-tungsten oxide may be obtained through the use of certain processing conditions, described below. While not wishing to be bound to any theory or mechanism, it is believed that amorphous nickel-tungsten oxide is produced by relatively higher energy atoms in the sputtering process. Higher energy atoms are obtained, for example, in a sputtering process with higher target powers, lower chamber pressures (that is, higher vacuum), and smaller source to substrate distances. Under the described process conditions, higher density films, with better stability under UV/heat exposure are produced.

In some embodiments, the thickness of the counter electrode is about 50 nm to about 650 nm. In some embodiments, the thickness of the counter electrode is about 100 nm to about 400 nm, preferably in the range of about 200 nm to 300 nm. The thickness of the counter electrode layer 510 is also substantially uniform. In one embodiment, a substantially uniform counter electrode layer varies only about ±10% in each of the aforementioned thickness ranges. In another embodiment, a substantially uniform counter electrode layer varies only about ±5% in each of the aforementioned thickness ranges. In another embodiment, a substantially uniform counter electrode layer varies only about ±3% in each of the aforementioned thickness ranges.

The amount of ions held in the counter electrode layer during the bleached state (and correspondingly in the electrochromic layer during the colored state) and available to drive the electrochromic transition depends on the composition of the layers as well as the thickness of the layers and the fabrication method. Both the electrochromic layer and the counter electrode layer are capable of supporting available charge (in the form of lithium ions and electrons) in the neighborhood of several tens of millicoulombs per square centimeter of layer surface area. The charge capacity of an electrochromic film is the amount of charge that can be loaded and unloaded reversibly per unit area and unit thickness of the film by applying an external voltage or potential. In one embodiment, the $WO_3$ layer has a charge capacity of between about 30 $mC/cm^2$/micron and about 150 $mC/cm^2$/micron. In another embodiment, the $WO_3$ layer has a charge capacity of between about 50 $mC/cm^2$/micron and about 100 $mC/cm^2$/micron. In one embodiment, the NiWO layer has a charge capacity of between about 75 $mC/cm^2$/micron and about 200 $mC/cm^2$/micron. In another embodiment, the NiWO layer has a charge capacity of between about 100 $mC/cm^2$/micron and about 150 $mC/cm^2$/micron.

In electrochromic devices with distinct layers, between electrochromic layer 506 and counter electrode layer 510, there is an ion conducting layer 508. Ion conducting layer 508 serves as a medium through which ions are transported (in the manner of an electrolyte) when the electrochromic device transforms between the bleached state and the colored state. Preferably, ion conducting layer 508 is highly conductive to the relevant ions for the electrochromic and the counter electrode layers, but has sufficiently low electron conductivity that negligible electron transfer takes place during normal operation. A thin ion conducting layer with high ionic conductivity permits fast ion conduction and hence fast switching for high performance electrochromic devices. In certain embodiments, the ion conducting layer 508 is inorganic and/or solid. When fabricated from a material and in a manner that produces relatively few defects, the ion conductor layer can be made very thin to produce a high performance device. In various implementations, the ion conductor material has an ionic conductivity of between about $10^8$ Siemens/cm or $ohm^{-1} cm^{-1}$ and about $10^9$ Siemens/cm or $ohm^{-1} cm^{-1}$ and an electronic resistance of about $10^{11}$ ohms-cm.

Examples of suitable ion conducting layers (for electrochromic devices having a distinct IC layer) include silicates, silicon oxides, tungsten oxides, tantalum oxides, niobium oxides, and borates. The silicon oxides include silicon-aluminum-oxide. These materials may be doped with different dopants, including lithium. Lithium doped silicon oxides include lithium silicon-aluminum-oxide. In some embodiments, the ion conducting layer comprises a silicate-based structure. In other embodiments, suitable ion conductors particularly adapted for lithium ion transport include, but are not limited to, lithium silicate, lithium aluminum silicate, lithium aluminum borate, lithium aluminum fluoride, lithium borate, lithium nitride, lithium zirconium silicate, lithium niobate, lithium borosilicate, lithium phosphosilicate, and other such lithium-based ceramic materials, silicas, or silicon oxides, including lithium silicon-oxide. Any material, however, may be used for the ion conducting layer 508 provided it can be fabricated with low defectivity and it allows for the passage of ions between the counter electrode layer 510 to the electrochromic layer 506 while substantially preventing the passage of electrons.

In certain embodiments, the ion conducting layer is crystalline, nanocrystalline, or amorphous. Typically, the ion conducting layer is amorphous. In another embodiment, the ion conducting layer is nanocrystalline. In yet another embodiment, the ion conducting layer is crystalline.

In some embodiments, a silicon-aluminum-oxide (SiAlO) is used for the ion conducting layer 508. In a specific embodiment, a silicon/aluminum target used to fabricate the ion conductor layer via sputtering contains between about 6 and about 20 atomic percent aluminum. This defines the ratio of silicon to aluminum in the ion conducting layer. In some embodiments, the silicon-aluminum-oxide ion conducting layer 508 is amorphous.

The thickness of the ion conducting layer 508 may vary depending on the material. In some embodiments, the ion conducting layer 508 is about 5 nm to about 100 nm thick, preferably about 10 nm to about 60 nm thick. In some embodiments, the ion conducting layer is about 15 nm to about 40 nm thick or about 25 nm to about 30 nm thick. The thickness of the ion conducting layer is also substantially uniform. In one embodiment, a substantially uniform ion conducting layer varies by not more than about ±10% in each of the aforementioned thickness ranges. In another embodiment, a substantially uniform ion conducting layer varies by not more than about ±5% in each of the aforementioned thickness ranges. In another embodiment, a substantially uniform ion conducting layer varies by not more than about ±3% in each of the aforementioned thickness ranges.

Ions transported across the ion conducting layer between the electrochromic layer and the counter electrode layer serve to effect a color change in the electrochromic layer (that is, change the electrochromic device from the bleached state to the colored state). Depending on the choice of materials for the electrochromic device stack, such ions include lithium ions ($Li^+$) and hydrogen ions ($H^+$) (that is, protons). As mentioned above, other ions may be employed in certain embodiments. These include deuterium ions ($D^+$), sodium ions ($Na^+$), potassium ions ($K^+$), calcium ions ($Ca^{++}$), barium ions ($Ba^{++}$), strontium ions ($Sr^{++}$), and magnesium ions ($Mg^{++}$).

As noted, the ion conducting layer 508 should have very few defects. Among other problems, defects in the ion conducting layer may result in short circuits between the electrochromic layer and the counter electrode layer. A short circuit occurs when electrical communication is established between oppositely charged conductive layers, for example a conductive particle makes contact with each of two conductive and electrically charged layers (as opposed to a "pin hole" which is a defect which does not create a short circuit between oppositely charged conductive layers). When a short circuit occurs, electrons rather than ions migrate between the electrochromic layer and the counter electrode, typically resulting in bright spots (that is, spots where the window does not switch but instead, maintains the open circuit coloration which is often much lighter than the colored state) at the location of the short when the electrochromic device is otherwise in the colored state. The ion conducting layer is preferably as thin as possible, without any shorts between the electrochromic layer and the counter electrode layer. As indicated, low defectivity in the ion conducting layer 508 (or elsewhere in the electrochromic device) allows for a thinner ion conducting layer 508. Ion transport between the electrochromic layer and the counter electrode layer with electrochemical cycling is faster when using a thin ion conducting layer. To generalize, the defectivity criteria specified herein may apply to any specific layer (ion conducting layer or otherwise) in the stack or to the stack as a whole or to any portion thereof. Defectivity criteria will be further discussed below.

The electrochromic device 500 may include one or more additional layers (not shown) such as one or more passive layers. Passive layers used to improve certain optical properties may be included in electrochromic device 500. Passive layers for providing moisture or scratch resistance may also be included in the electrochromic device 500. For example, the conductive layers may be treated with anti-reflective or protective oxide or nitride layers. Other passive layers may serve to hermetically seal the electrochromic device 500.

FIG. 5 is a schematic cross-section of an electrochromic device in a bleached state (or transitioning to a bleached state). In accordance with specific embodiments, the electrochromic device 600 includes a tungsten oxide electrochromic layer 606 and a nickel-tungsten oxide counter electrode layer 610. In some cases, the tungsten oxide electrochromic layer 606 has a nanocrystalline, or substantially nanocrystalline, morphology. In some embodiments, the nickel-tungsten oxide counter electrode layer 610 has an amorphous, or substantially amorphous, morphology. In some embodiments, the weight percent ratio of tungsten to nickel in the nickel-tungsten oxide is between about 0.40 and about 0.60.

The electrochromic device 600 also includes substrate 602, conductive layer 604, ion conducting layer 608, and conductive layer 614. In some embodiments, the substrate 602 and conductive layer 604 together comprise a TEC-Glass™. As indicated, the electrochromic devices described herein, such as those of FIG. 5, often find beneficial application in architectural glass. Thus, in some embodiments, the substrate 602 is of the dimensions such that it may be classified as architectural glass. In some embodiments, the conductive layer 614 is indium tin oxide (ITO). In some embodiments, the ion conducting layer 608 is a silicon-aluminum-oxide.

The voltage source 616 is configured to apply a potential to electrochromic stack 620 through suitable connections (for example, bus bars) to conductive layers 604 and 614. In some embodiments, the voltage source is configured to apply a potential of about 2 volts in order to drive a transition of the device from one optical state to another. The polarity of the potential as shown in FIG. 5 is such that the ions (lithium ions in this example) primarily reside (as indicated by the dashed arrow) in nickel-tungsten oxide counter electrode layer 610.

In embodiments employing tungsten oxide as the electrochromic layer and nickel-tungsten oxide as the counter electrode layer, the ratio of the electrochromic layer thickness to the counter electrode layer thickness may be about 1.7:1 to about 2.3:1 (for example, about 2:1). In some embodiments, the electrochromic tungsten oxide layer is about 200 nm to about 700 nm thick. In further embodiments, the electrochromic tungsten oxide layer is about 400 nm to about 500 nm thick. In some embodiments, the nickel-tungsten oxide counter electrode layer is about 100 nm to about 350 nm thick. In further embodiments, and the nickel-tungsten oxide counter electrode layer is about 200 nm to about 250 nm thick. In yet further embodiments, the nickel-tungsten oxide counter electrode layer is about 240 nm thick. Also, in some embodiments, the silicon-aluminum-oxide ion conducting layer 608 is about 10 nm to about 100 nm thick. In further embodiments, the silicon-aluminum-oxide ion conducting layer is about 20 nm to about 50 nm thick.

As indicated above, electrochromic materials may contain blind charge. The blind charge in an electrochromic material is the charge (for example, negative charge in the cases of tungsten oxide electrochromic material) that exists in the material as fabricated, absent compensation by oppositely charged ions or other charge carriers. With tungsten oxide, for example, the magnitude of the blind charge depends upon the excess oxygen concentration during sputtering of the tungsten oxide. Functionally, blind charge must be compensated before the ions employed to transform the electrochromic material can effectively change an optical property of the electrochromic material. Without prior compensation of the blind charge, ions supplied to an electrochromic material will irreversibly incorporate in the material and have no effect on the optical state of the material. Thus, an electrochromic device is typically provided with ions, such as lithium ions or protons, in an amount sufficient both to compensate the blind charge and to provide a supply of ions for reversibly switching the electrochromic material between two optical states. In many known electrochromic devices, charge is lost during the first electrochemical cycle in compensating blind charge.

In some embodiments, lithium is present in the electrochromic stack 620 in an amount sufficient to compensate the blind charge in the electrochromic layer 606 and then an additional amount of about 1.5 to 2.5 times the amount used to compensate the blind charge (by mass) in the stack (initially in the counter electrode layer 610 for example). That is, there is about 1.5 to 2.5 times the amount of lithium needed to compensate the blind charge that is provided for reversible cycling between the electrochromic layer 606 and the counter electrode layer 610 in the electrochromic stack 620. In some embodiments, there are enough lithium in the electrochromic stack 620 to compensate the blind charge in the electrochromic layer 606 and then about two times this amount (by mass) in the counter electrode layer 610 or elsewhere in the stack.

FIG. 6 is a schematic cross-section of electrochromic device 600 shown in FIG. 5 but in a colored state (or transitioning to a colored state). In FIG. 6, the polarity of voltage source 616 is reversed, so that the electrochromic layer is made more negative to accept additional lithium ions, and thereby transition to the colored state. As indicated by the dashed arrow, lithium ions are transported across the ion conducting layer 608 to the tungsten oxide electrochromic layer 606. The tungsten oxide electrochromic layer 606 is shown in the colored state. The nickel-tungsten oxide counter electrode 610 is also shown in the colored state. As explained, nickel-tungsten oxide becomes progressively more opaque as it gives up (deintercalates) lithium ions. In this example, there is a synergistic effect where the transition to colored states for both layers 606 and 610 are additive toward reducing the amount of light transmitted through the stack and substrate.

In some implementations, the components of the of electrochromic device 500 of FIG. 4 may be may be substantially similar to the components of electrochromic device 600 discussed with respect to FIGS. 5 and 6.

The all solid state and inorganic electrochromic devices described above have low defectivity and high reliability, and thus are particularly well suited for embodiments described herein. Other low defectivity all solid state and inorganic electrochromic devices are described below.

Low-Defectivity Solid State and Inorganic Electrochromic Devices without a Distinct IC Layer As described above, an electrochromic device typically includes an electrochromic (also called "EC") electrode layer and a counter electrode (also called "CE") layer, separated by an ionically conductive (also called "IC") layer that is highly conductive to ions and highly resistive to electrons. As conventionally understood, the ionically conductive layer therefore prevents shorting between the electrochromic layer and the counter electrode layer. The ionically conductive layer allows the electrochromic and counter electrodes to hold a charge and thereby maintain their bleached or colored states. In electrochromic devices having distinct layers, the components form a stack which includes the ion conducting layer sandwiched between the electrochromic electrode layer and the counter electrode layer. The boundaries between these three stack components are defined by abrupt changes in composition and/or microstructure. Thus, the devices have three distinct layers with two abrupt interfaces.

Quite surprisingly, it has been discovered that high quality electrochromic devices can be fabricated without depositing an ionically conducting electrically insulating layer. In accordance with certain embodiments, the counter electrode and electrochromic electrodes are formed immediately adjacent one another, often in direct contact, without separately depositing an ionically conducting layer. It is believed that various fabrication processes and/or physical or chemical mechanisms produce an interfacial region between contacting electrochromic and counter electrode layers, and that this interfacial region serves at least some functions of an ionically conductive electron insulating layer in devices having such a distinct layer.

In some embodiments, such electrochromic devices having an ion conducting electron insulating interfacial region rather than a distinct IC layer are employed in one or more panes of multi-pane window units described herein. Such devices, and methods of fabricating them, are described in U.S. patent applications, Ser. No. 12/772,055 (now U.S. Pat. No. 8,300,298) and Ser. No. 12/772,075 (now U.S. Pat. No. 8,582,193), each filed on Apr. 30, 2010, in U.S. patent application Ser. Nos. 12/814,277 and 12/814,279, each filed on Jun. 11, 2010, and in U.S. patent application Ser. No. 13/166,537 (U.S. Pat. No. 8,228,592), filed on Jun. 22, 2011—each of the applications is entitled "Electrochromic Devices," each names Zhongchun Wang et al. as inventors, and each is hereby incorporated by reference in its entirety. These electrochromic devices can also be made with low defectivity and thus are particularly well suited for multipane window units described herein. A brief description of these devices follows.

Figure 7:
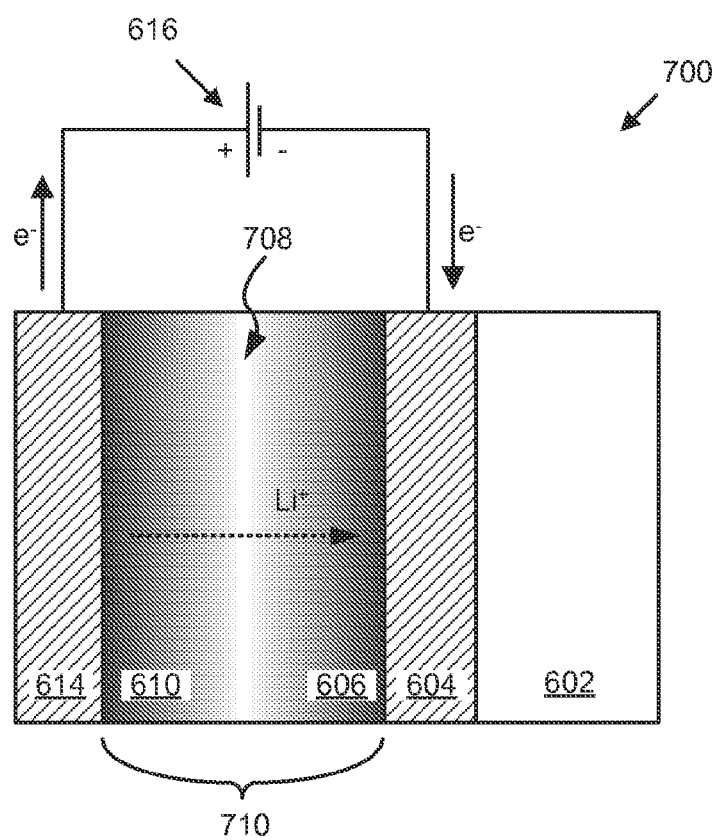
FIG. 7 is a schematic cross-section of an electrochromic device having an ion conducting electronically insulating interfacial region rather than a distinct ionically conductive (also called "IC") layer.

FIG. 7 is a schematic cross-section of an electrochromic device, 700, in a colored state, where the device has an ion conducting electron insulating interfacial region, 708, serving at least some functions of a distinct IC layer. Voltage source 616, conductive layers 614 and 604, and substrate 602 are essentially the same as described in relation to FIGS. 5 and 6. Between conductive layers 614 and 604 is a region 710, which includes counter electrode layer 610, electrochromic layer 606, and an ion conducting electron insulating interfacial region, 708, between them, rather than a distinct IC layer. In this example, there is no distinct boundary between counter electrode layer 610 and interfacial region 708, nor is there a distinct boundary between electrochromic layer 606 and interfacial region 708. Rather, there is a diffuse transition between CE layer 610 and interfacial region 708, and between interfacial region 708 and EC layer 606. Conventional wisdom was that each of the three layers should be laid down as distinct, uniformly deposited and smooth layers to form a stack. The interface between each layer should be "clean" where there is little intermixing of materials from each layer at the interface. One of ordinary skill in the art would recognize that in a practical sense there is inevitably some degree of material mixing at layer interfaces, but the point is, in conventional fabrication methods any such mixing is unintentional and minimal. The interfacial regions serving as IC layers can be formed where the interfacial region includes significant quantities of one or more electrochromic and/or counter electrode materials by design. This is a radical departure from conventional fabrication methods. These all solid state and inorganic electrochromic devices also have low defectivity and reliability, and thus are particularly well suited for embodiments described herein.

Although the foregoing embodiments have been described in some detail to facilitate understanding, the described embodiments are to be considered illustrative and not limiting.

What is claimed is:

1. An insulating glass unit comprising:
   a first pane having an electrochromic device disposed thereon;
   a second pane having an array of electromechanical systems devices configured to vary transmission of visible light between actuated and non-actuated states, wherein the array of electromechanical systems devices is configured to be controlled independently of the electrochromic device; and
   a sealing separator defining, together with the first and second panes, an interior region that is thermally insulating;
   wherein the insulated glass unit has at least four optical states with different levels of transmissivity of visible light and wherein the array of electromechanical systems devices is configured to operate at variable speeds of transition between different transmission states of visible light.

2. The insulating glass unit of claim 1, further comprising leads for connecting the electrochromic device to a power source.

3. The insulating glass unit of claim 1, wherein the electromechanical systems devices are microelectromechanical systems.

4. The insulating glass unit of claim 1, further comprising a controller configured to control two or more optical states of the electrochromic device and independently control the actuated and non-actuated states of the array of electromechanical systems devices.

5. The insulating glass unit of claim 1, wherein the electrochromic device and the array of electromechanical systems devices face the interior region.

6. A method of fabricating an insulating glass unit, the method including:
arranging a first pane of architectural glass and a second pane of architectural glass in a substantially parallel arrangement, wherein the first pane includes an electrochromic device disposed thereon, and the second pane includes an array of electromechanical systems devices configured to vary transmission of visible light between actuated and non-actuated states and configured to operate at variable speeds of transition between different transmission states of visible light, wherein the array of electromechanical systems devices is configured to be controlled independently of the electrochromic device, wherein the insulated glass unit has at least four optical states with different levels of transmissivity of visible light;
providing a sealing separator between the first and second panes, the sealing separator defining, together with the first and second panes, a thermally-insulating interior region between the first and second panes; and
charging the thermally-insulating interior region of the insulating glass unit with an inert gas.

7. A multi-pane window unit comprising:
a first pane having an electrochromic device thereon;
a second pane; and
an array of electromechanical systems devices disposed on the second pane, wherein the second pane is laminated to the first pane, the array of electromechanical systems devices configured to vary transmission of visible light between actuated and non-actuated states, wherein the array of electromechanical systems devices is configured to be controlled independently of the electrochromic device,
wherein the multi-pane window has at least four optical states with different levels of transmissivity of visible light and wherein the array of electromechanical systems devices is configured to operate at variable speeds of transition between different transmission states of visible light.

8. The multi-pane window unit of claim 7, further comprising:
a third pane; and
a separator between the third pane and the laminated first and second panes.

9. The multi-pane window unit of claim 8, wherein the third pane is located on an outward side of the multi-pane window.

10. The multi-pane window unit of claim 8, further comprising a second electrochromic device disposed on the third pane.

11. The multi-pane window unit of claim 10, wherein the second electrochromic device is disposed on a surface of the third pane facing an interior region of the multi-pane window unit.

12. The multi-pane window unit of claim 8, wherein the separator comprises a spacer and a seal between the spacer and each of the third pane and the second pane.

13. The multi-pane window unit of claim 12, wherein the separator defines, together with the third and second pane, an interior region.

14. The multi-pane window unit of claim 13, wherein the interior region is thermally insulating.

15. The multi-pane window unit of claim 8, further comprising a second electrochromic device disposed on the second pane.

16. The multi-pane window unit of claim 10, wherein the second electrochromic device is disposed on a surface of the second pane facing outward.

17. The multi-pane window unit of claim 8,
wherein the electrochromic device has at least two optical states, and
wherein the array of electromechanical systems devices has two states.

18. The multi-pane window unit of claim 7, wherein the electromechanical systems devices are microelectromechanical systems.

19. A substantially transparent substrate comprising:
a first side;
a second side opposing the first side;
an electrochromic device disposed on the first side; and
an array of electromechanical systems devices disposed on one of the first and second sides, the array of electromechanical systems configured to vary transmission of visible light between actuated and non-actuated states, wherein the array of electromechanical systems devices is controlled independently of the electrochromic device,
wherein the electrochromic device and the array of electromechanical systems have at least four optical states with different levels of transmissivity of visible light and wherein the array of electromechanical systems devices is disposed in tandem with and on the electrochromic device.

20. The substantially transparent substrate of claim 19, wherein the array of electromechanical systems devices is disposed on the second side.

21. The substantially transparent substrate of claim 19, wherein the array of electromechanical systems devices is disposed on the first side.

22. The substantially transparent substrate of claim 19, further comprising another substantially transparent substrate laminated to the substantially transparent substrate.

23. The substantially transparent substrate of claim 19, wherein the substantially transparent substrate is one pane of an insulated glass unit.

24. The insulating glass unit of claim 1, further comprising one or more of an ultraviolet absorbing or reflective layer and an infrared absorbing or reflective layer.

25. The insulating glass unit of claim 1, wherein the array electromechanical systems devices comprises microshutters.

26. The insulating glass unit of claim 19, wherein the array of electromechanical systems devices is configured to operate at variable speeds of transition between different transmission states of visible light.

27. The insulating glass unit of claim 1, wherein the array of electromechanical systems devices is disposed in tandem with the electrochromic device.

28. The multi-pane window unit of claim 7, wherein the array of electromechanical systems devices comprises microshutters.

29. The multi-pane window unit of claim 7, wherein the array of electromechanical systems devices is disposed in tandem with the electrochromic device.

30. A substantially transparent substrate comprising:
a first side;
a second side opposing the first side;
an electrochromic device disposed on the first side; and
an array of electromechanical systems devices disposed on one of the first and second sides, the array of electromechanical systems configured to vary transmission of visible light between actuated and non-actuated states, wherein the array of electromechanical systems devices is controlled independently of the electrochromic device, wherein the electrochromic device and the array of electromechanical systems have at least four optical states with different levels of transmissivity of visible light and wherein the array of electromechanical systems devices is configured to operate at variable speeds of transition between different transmission states of visible light.

* * * * *